(12) United States Patent
Nakajima et al.

(10) Patent No.: US 10,318,370 B2
(45) Date of Patent: Jun. 11, 2019

(54) CIRCUIT DEVICE, PHYSICAL QUANTITY DETECTION DEVICE, OSCILLATOR, ELECTRONIC APPARATUS, VEHICLE, AND METHOD OF DETECTING FAILURE OF MASTER CLOCK SIGNAL

(71) Applicant: SEIKO EPSON CORPORATION, Tokyo (JP)

(72) Inventors: Kiminori Nakajima, Minowa-machi (JP); Takashi Aoyama, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 126 days.

(21) Appl. No.: 15/455,501

(22) Filed: Mar. 10, 2017

(65) Prior Publication Data

US 2017/0277585 A1    Sep. 28, 2017

(30) Foreign Application Priority Data

Mar. 25, 2016  (JP) .................................. 2016-062571
Sep. 23, 2016  (JP) .................................. 2016-185093

(51) Int. Cl.
   *G06F 11/00*   (2006.01)
   *G06F 11/07*   (2006.01)
   *H03K 19/21*   (2006.01)
   *H03K 3/037*   (2006.01)

(52) U.S. Cl.
   CPC ........ *G06F 11/079* (2013.01); *G06F 11/0706* (2013.01); *G06F 11/0757* (2013.01); *G06F 11/0772* (2013.01); *H03K 3/037* (2013.01); *H03K 19/21* (2013.01)

(58) Field of Classification Search
    USPC ........................................................ 714/55
    See application file for complete search history.

(56) References Cited

U.S. PATENT DOCUMENTS

| 2004/0221208 A1* | 11/2004 | Floyd ................. G06F 11/1604 714/50 |
| 2005/0099498 A1* | 5/2005 | Lao ........................ H04N 5/765 348/207.99 |
| 2009/0158087 A1* | 6/2009 | Maeno ................... G11C 29/44 714/6.12 |
| 2011/0035632 A1* | 2/2011 | Hong ................. G06F 11/0745 714/55 |
| 2011/0102092 A1* | 5/2011 | Raita ........................ G06F 1/08 331/108 C |
| 2015/0168467 A1* | 6/2015 | Haneda ................ G01R 23/165 702/191 |
| 2017/0249156 A1* | 8/2017 | Frey ........................ G06F 9/441 |
| 2018/0107622 A1* | 4/2018 | Zhang ..................... G06F 13/40 |

FOREIGN PATENT DOCUMENTS

JP    2012-181677 A    9/2012

\* cited by examiner

*Primary Examiner* — Sarai E Butler
(74) *Attorney, Agent, or Firm* — Oliff PLC

(57) ABSTRACT

A circuit device includes a control circuit that operates on the basis of a master clock signal, and an interface circuit that includes a register unit and transmits data on the basis of an external clock signal which is input from an external device. In addition, the register unit takes up error information of the master clock signal on the basis of the external clock signal and stores the taken-up error information. The interface circuit transmits the data, including the error information stored in the register unit.

18 Claims, 17 Drawing Sheets

CIRCUIT DEVICE, PHYSICAL QUANTITY DETECTION DEVICE, OSCILLATOR, ELECTRONIC APPARATUS, VEHICLE, AND METHOD OF DETECTING FAILURE OF MASTER CLOCK SIGNAL

BACKGROUND

1. Technical Field

The present invention relates to a circuit device, a physical quantity detection device, an oscillator, an electronic apparatus, a vehicle, a method of detecting a failure of a master clock signal, and the like.

2. Related Art

Defect diagnosis circuits maybe provided in circuit devices in order to diagnose various defects in the circuit devices. An external device, such as a CPU, reads out error information, which is output by the defect diagnosis circuit, through an interface circuit of the circuit device and performs an operation based on the error information. Related art of the defect diagnosis circuit includes, for example, a technique disclosed in JP-A-2012-181677. In JP-A-2012-181677, a defect diagnosis circuit performs defect diagnosis of a driving circuit driving a physical quantity transducer of a physical quantity detection device and a detection circuit detecting a physical quantity on the basis of a detection signal from the physical quantity transducer, and an interface circuit outputs error information.

In a case where the above-mentioned defect diagnosis circuit operates on the basis of a master clock signal for operating a circuit device (for example, a logic circuit or the like), there is a possibility that the defect diagnosis circuit cannot output error information when a failure occurs in the master clock signal. In this case, an external device cannot accurately know the presence or absence of an error of the circuit device, and thus there is a possibility that the external device cannot perform an operation according to the error.

SUMMARY

An advantage of some aspects of the invention is to provide a circuit device capable of transmitting error information for giving a notice of a failure to the outside even when the failure occurs in a master clock signal, a physical quantity detection device, an oscillator, an electronic apparatus, a vehicle, a method of detecting a failure of a master clock signal, and the like.

An aspect of the invention relates to a circuit device including a control circuit that operates on the basis of a master clock signal, and an interface circuit that includes a register unit and transmits data to an outside on the basis of an external clock signal which is input from an outside, in which the register unit takes up error information of the master clock signal on the basis of the external clock signal and stores the taken-up error information, and the interface circuit transmits the data, including the error information stored in the register unit, to an outside.

According to the aspect of the invention, the register unit storing the error information of the master clock signal takes up the error information on the basis of the external clock signal which is input from the outside. The information taken into the register unit is transmitted to the outside. Thereby, even when a failure occurs in the master clock signal, it is possible to transmit the error information for giving a notice of the failure to the outside.

In the aspect of the invention, the circuit device may further include a master clock signal failure detection circuit that detects a failure of the master clock signal and outputs the error information, indicating that the master clock signal is set to be in a failure state, to the register unit in a case where the failure is detected.

In this manner, in a case where the master clock signal failure detection circuit detects a failure of the master clock signal, the error information is set to be information indicating that the master clock signal is set to be in a failure state. For example, an error signal corresponding to the error information is set to be in an active state. The error information is taken into the register unit on the basis of the external clock signal. Thereby, it is possible to transmit the error information indicating that the master clock signal is set to be in a failure state, to the outside.

In the aspect of the invention, the register unit may take up the error information from the master clock signal failure detection circuit on the basis of the external clock signal.

In this manner, the error information of the master clock signal is taken into the register unit on the basis of the external clock signal which is supplied independently of the master clock signal. Thereby, even when the master clock signal is set to be in a failure state, it is possible to transmit the error information to the outside.

In the aspect of the invention, the master clock signal failure detection circuit may detect a failure of the master clock signal on the basis of an error detection clock signal which is a clock signal different from the master clock signal, and may output the error information to the register unit.

In this manner, even when the master clock signal is set to be in a failure state, it is possible to detect the failure of the master clock signal on the basis of the error detection clock signal and to output the error information to the register unit. Thereby, in a case where the master clock signal is set to be in a failure state, it is possible to transmit error information indicating the occurrence of a failure in the master clock signal, to the outside.

In the aspect of the invention, the circuit device may further include a driving circuit that oscillates a vibrator, in which the error detection clock signal may be a clock signal which is generated by oscillating the vibrator.

In this manner, the clock signal generated by oscillating the vibrator is used as the error detection clock signal, and thus it is possible to monitor the master clock signal by the clock signal independent of the master clock signal. In addition, the clock signal which is present within the circuit device is used, and thus it is not necessary to redundantly provide a clock signal generation circuit.

In the aspect of the invention, the master clock signal failure detection circuit may include a first flip flop circuit that latches an input clock signal based on the master clock signal, on the basis of an error detection clock signal which is a clock signal different from the master clock signal, a second flip flop circuit that latches a first output signal from the first flip flop circuit on the basis of the error detection clock signal, an exclusive OR circuit that obtains an exclusive OR of the first output signal and a second output signal from the second flip flop circuit, and a counter that counts a period of time for which an output signal of the exclusive OR circuit is set to be a first logic level, on the basis of the error detection clock signal, and outputs the error information indicating that the master clock signal is set to be in a failure state, in a case where a counted value is set to be a predetermined value.

When a logic level of the master clock signal does not change, a logic level of an output signal of the exclusive OR circuit does not change from the first logic level. In a case where the counter detects that the unchanged state of the logic level is continued for a predetermined period of time, the counter sets the error information to be information indicating that the master clock signal is set to be in a failure state. For example, an error signal corresponding to the error information is set to be in an active state. In this manner, it is possible to detect that the master clock signal is set to be in a failure state.

In the aspect of the invention, the circuit device may further include a defect diagnosis circuit that operates by the master clock signal, in which the register unit may include a failure diagnosis resister that takes up error information from the defect diagnosis circuit.

In this manner, in a case where the defect diagnosis circuit operates on the basis of the master clock signal, the operation of the defect diagnosis circuit is stopped in a case where the master clock signal is set to be in a failure state. Then, even when an error occurs in the circuit device, it is not possible to detect the error and to take up correct error information into the register unit of the interface circuit, and thus the error is not notified to the outside. In this respect, according to the aspect of the invention, it is possible to notify the outside that at least the master clock signal is set to be in a failure state.

In the aspect of the invention, the interface circuit may be an interface circuit of a serial peripheral interface (SPI) system or an inter-integrated circuit (I2C) system.

In such a serial interface, communication is performed using a serial clock line. In the aspect of the invention, error information of the master clock signal is taken into the register unit of the interface circuit by using a serial clock signal which is input from the serial clock line as an external clock signal. Thereby, it is possible to transmit the error information of the master clock signal to the outside through the serial interface.

In the aspect of the invention, the circuit device may further include a master clock signal generation circuit that generates the master clock signal.

According to the aspect of the invention, it is possible to operate the control circuit by the master clock signal generated by the master clock signal generation circuit. It is possible to take up error information of the master clock signal in the register unit on the basis of the external clock signal and to transmit data including the error information to the outside.

Another aspect of the invention relates to a circuit device including a master clock signal failure detection circuit that detects a failure of a master clock signal, and a register unit that takes up error information of the master clock signal on the basis of an external clock signal which is input from an outside.

In this manner, in a case where the master clock signal failure detection circuit detects a failure of the master clock signal, error information serves as information indicating that the master clock signal is set to be in a failure state. For example, an error signal corresponding to the error information is set to be in an active state. It is possible to take up the error information in the register unit on the basis of the external clock signal.

In the aspect of the invention, the circuit device may further include an interface circuit that transmits data including the error information stored in the register unit to an outside on the basis of the external clock signal.

In this manner, it is possible to transmit data including the error information taken up in the register unit to the outside on the basis of the external clock signal. Thereby, it is possible to transmit the error information for giving notice of a failure to the outside even when the failure occurs in the master clock signal.

Still another aspect of the invention relates to a circuit device including a failure detection circuit that detects a failure of a first clock signal on the basis of a second clock signal different from the first clock signal, and a register unit that takes up error information of the first clock signal on the basis of a third clock signal which is an external clock signal input from an outside.

In this manner, the failure detection circuit can detect the failure of the first clock signal on the basis of the second clock signal different from the first clock signal. In a case where the failure of the first clock signal is detected, the error information serves as information indicating that the first clock signal is set to be in a failure state. For example, an error signal corresponding to the error information is set to be in an active state. It is possible to take up the error information in the register unit on the basis of the third clock signal which is an external clock signal.

Still another aspect of the invention relates to a physical quantity detection device including any one of the above-described circuit devices, and a physical quantity transducer.

In the another aspect of the invention, the physical quantity transducer may be at least one of an acceleration detection element and an angular velocity detection element.

Still another aspect of the invention relates to an oscillator including any one of the above-described circuit devices, and a vibrator.

Still another aspect of the invention relates to an electronic apparatus including any one of the above-described circuit devices.

Still another aspect of the invention relates to a vehicle including any one of the above-described circuit devices.

Still another aspect of the invention relates to a method of detecting a failure of a master clock signal, the method including detecting a failure of the master clock signal by a clock signal other than the master clock signal, taking up error information of the master clock signal in a register unit on the basis of an external clock signal which is input from an outside, and transmitting data including the error information stored in the register unit to an outside on the basis of the external clock signal.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. Meanwhile, the present embodiment to be described below does not unduly limit the content of the invention described in the appended claims, and not all of the features described in the present embodiment are essential for solving means of the invention.

1. Configuration

Figure 1:
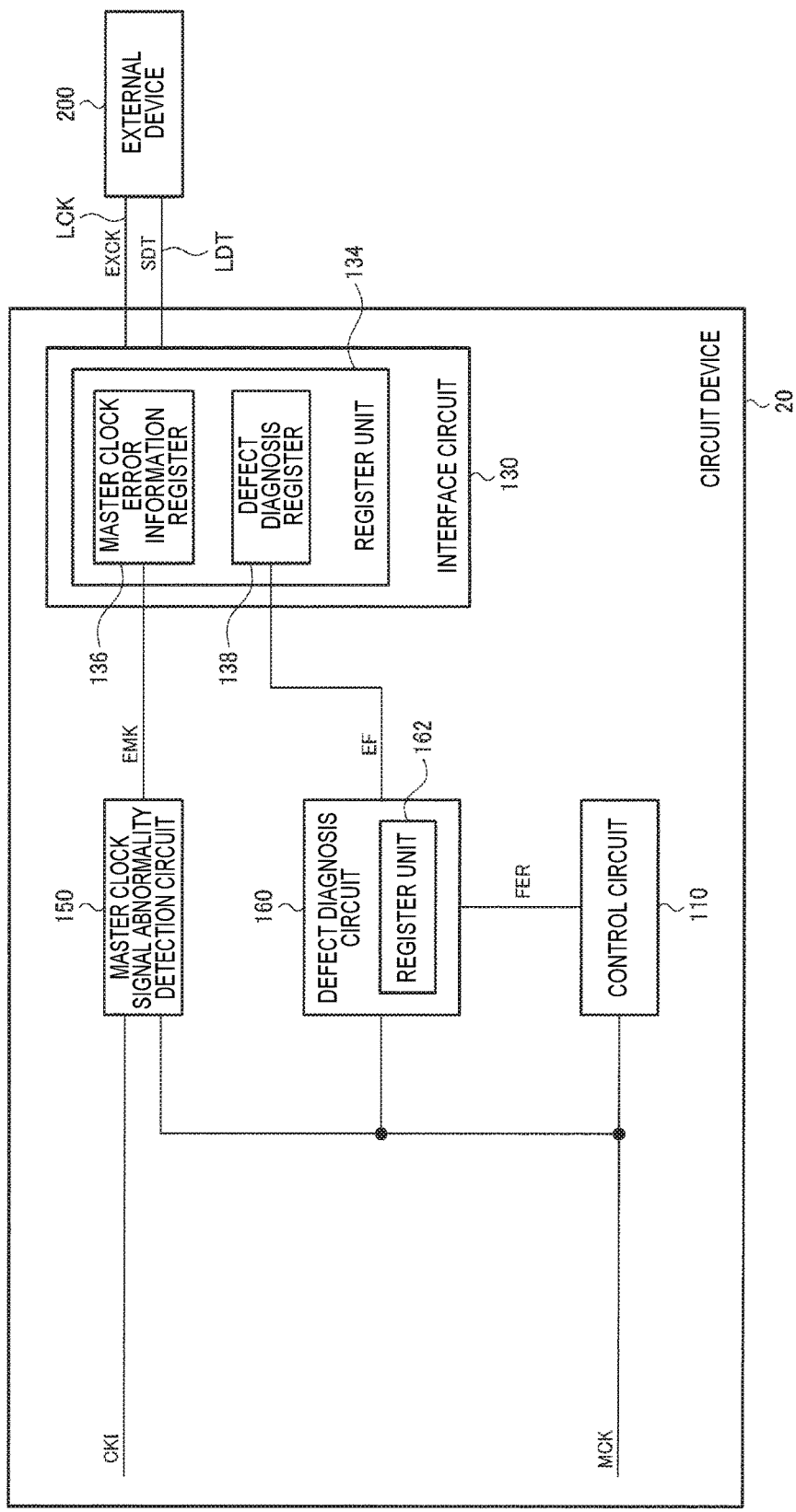
FIG. 1 illustrates an example of a first configuration of a circuit device according to this embodiment.

FIG. 1 illustrates an example of a first configuration of a circuit device 20 according to this embodiment. The circuit device 20 includes a master clock signal failure detection circuit 150, a defect diagnosis circuit 160, an interface circuit 130, and a control circuit 110 (processing circuit). The circuit device 20 is configured as, for example, an integrated circuit device.

A master clock signal MCK is a clock signal for driving the circuit device 20 (for example, for synchronously operating a logic circuit). For example, as described later in FIG. 4, the master clock signal MCK is supplied from a master clock signal generation circuit 120 provided in the circuit device 20 to each unit of the circuit device 20. Alternatively, the master clock signal MCK is input from the outside (for example, an oscillator, an oscillation circuit, an clock generation circuit, a circuit device including any of the oscillator and these circuits, or the like) of the circuit device 20 through a clock signal input terminal of the circuit device 20, and the input master clock signal MCK is supplied to each unit of the circuit device 20.

The control circuit 110 controls each unit of the circuit device 20 or performs various digital signal processing. The control circuit 110 is a logic circuit that operates on the basis of the master clock signal MCK. For example, the control circuit 110 includes a plurality of flip flop circuits and a combination circuit which is provided between the flip flop circuits. The flip flop circuit takes up an output of the combination circuit in accordance with the master clock signal MCK. Such a synchronous operation corresponds to an operation based on the master clock signal MCK. For example, as described later in FIG. 13 and the like, in a case where the circuit device 20 (20a) is applied to a physical quantity detection device 300 that detects an angular velocity or an acceleration, the control circuit 110 (110a) controls the operation of a driving circuit 30 and the detection circuit 60, and controls communication through the interface circuit 130 (130a). In addition, the control circuit 110 (110a) performs filtering, temperature compensation processing, or the like with respect to angular velocity data or acceleration data detected, as digital signal processing. The control circuit 110 may be realized by an ASIC such as a gate array, or may be realized by a processor (DSP, CPU) and a program (program module) operating on the processor.

The defect diagnosis circuit 160 is a circuit that outputs error information EF (error signal) of each unit of the circuit device 20. Specifically, the defect diagnosis circuit 160 includes a register unit 162 (register circuit) that stores the error information EF. The register unit 162 takes up (latches) the error information EF on the basis of the master clock signal MCK, and outputs the taken-up error information EF to the interface circuit 130. The defect diagnosis circuit 160 is constituted by, for example, a logic circuit and the like, and a portion or the entirety thereof may be integrally formed with the control circuit 110.

The error information EF is information indicating whether or not a failure has occurred in a circuit, a signal, or the like corresponding to the error information EF, or information indicating the type of failure. That is, a failure detection signal is input to the defect diagnosis circuit 160 from each unit of the circuit device 20, thereby generating the error information EF on the basis of the failure detection signal. A failure detection signal FER is input to the defect diagnosis circuit 160 from, for example, a failure detection circuit of the control circuit 110. Alternatively, as described later in FIG. 13 and the like, in a case where the circuit device 20 (20a) is applied to the physical quantity detection device 300 that detects an angular velocity or an acceleration, a failure detection signal is input to the defect diagnosis circuit 160 (160a) from a failure detection circuit of the driving circuit 30 or the detection circuit 60. The defect diagnosis circuit 160 (160a) may use a failure detection signal from each unit as the error information EF as it is, or may generate the error information EF by processing the failure detection signal (for example, by performing logical operation of one or a plurality of failure detection signals). The error information EF is, for example, an error signal (for example, an error flag). In a case where a failure is detected in a circuit corresponding to the error signal or in a case where a type of failure which corresponds to the error signal is detected in a circuit, the error signal is set to be in an active state.

The master clock signal failure detection circuit 150 detects a failure of the master clock signal MCK on the basis of an error detection clock signal CKI which is a clock signal different from the master clock signal MCK, and outputs error information EMK (error signal) to the interface circuit 130. The error information EMK is information indicating whether or not a failure has occurred in the master clock signal MCK, and is, for example, an error signal (for example, an error flag). The error signal is set to be in an active state in a case where a failure of the master clock signal MCK is detected. The failure of the master clock signal MCK is, for example, the stop of the master clock signal MCK and is, for example, a state where a logic level of the master clock signal MCK is fixed to a high level or a low level. The cause of the failure is, for example, a failure (defect) of a circuit generating the master clock signal MCK (for example, the master clock signal generation circuit 120 of FIG. 4 or a master clock signal generation circuit provided outside the circuit device 20), or disconnection or a short-circuit in a transmission path of the master clock signal MCK.

The error detection clock signal CKI is a clock signal which is independent of the master clock signal MCK. That is, the error detection clock signal is a clock signal which is supplied from a circuit different from the circuit generating the master clock signal MCK (for example, the master clock signal generation circuit 120 of FIG. 4 or a master clock signal generation circuit provided outside the circuit device 20). The error detection clock signal CKI may be supplied from an internal circuit of the circuit device 20, or may be supplied from an external circuit of the circuit device 20. It is preferable that the error detection clock signal CKI is a clock signal set to be in an active state while the master clock signal MCK is in an active state. For example, as described later in FIG. 14 and the like, in a case where the circuit device 20 (20a) is applied to an angular velocity sensor (gyro sensor), a signal SYC (signal for synchronous detection) from the driving circuit 30 driving a vibrator 10 is used as the error detection clock signal CKI. Alternatively, as described later in FIG. 16 and the like, in a case where the circuit device 20 (20b) is applied to an oscillator 500, an oscillation signal OSCK from an oscillation signal generation circuit 530 generating the oscillation signal OSCK by using a vibrator XTAL is used as the error detection clock signal CKI.

The interface circuit 130 is a circuit that performs communication (transmission and reception of a command or data) between the circuit device 20 and an external device 200. The external device 200 is a processor, such as a central processing unit (CPU) or a microcomputer controlling the circuit device 20, an application specific integrated circuit (ASIC), an electronic control unit or an engine control unit (ECU) of an automobile, or the like. An external clock signal EXCK which is a clock signal from the external device 200 is input to the interface circuit 130 through a clock line LCK. In more detail, a pulse of the external clock signal EXCK is input through the clock line LCK during a communication period for which the transmission and reception of a command or data are performed, and an external clock signal is fixed to a constant potential out of the communication period. In addition, the interface circuit 130 and the external device 200 exchange (input and output) data SDT (including a command) through a data line LDT.

The interface circuit 130 includes a register unit 134 (register circuit) that operates on the basis of the external clock signal EXCK. The interface circuit 130 stores the data SDT, which is transmitted from the external device 200 through the data line LDT, in the register unit 134. In addition, the interface circuit 130 stores information (data) from each unit of the circuit device 20 in the register unit 134, and outputs the data SDT, including information (data), which is stored in the register unit 134 to the data line LDT in accordance with a read-out request command from the external device 200. For example, the register unit 134 includes a master clock signal error information register 136 that takes up the error information EMK from the master clock signal failure detection circuit 150 on the basis of the external clock signal EXCK, and a failure diagnosis resister 138 that takes up the error information EF from the defect diagnosis circuit 160 on the basis of the external clock signal EXCK.

Figure 2:
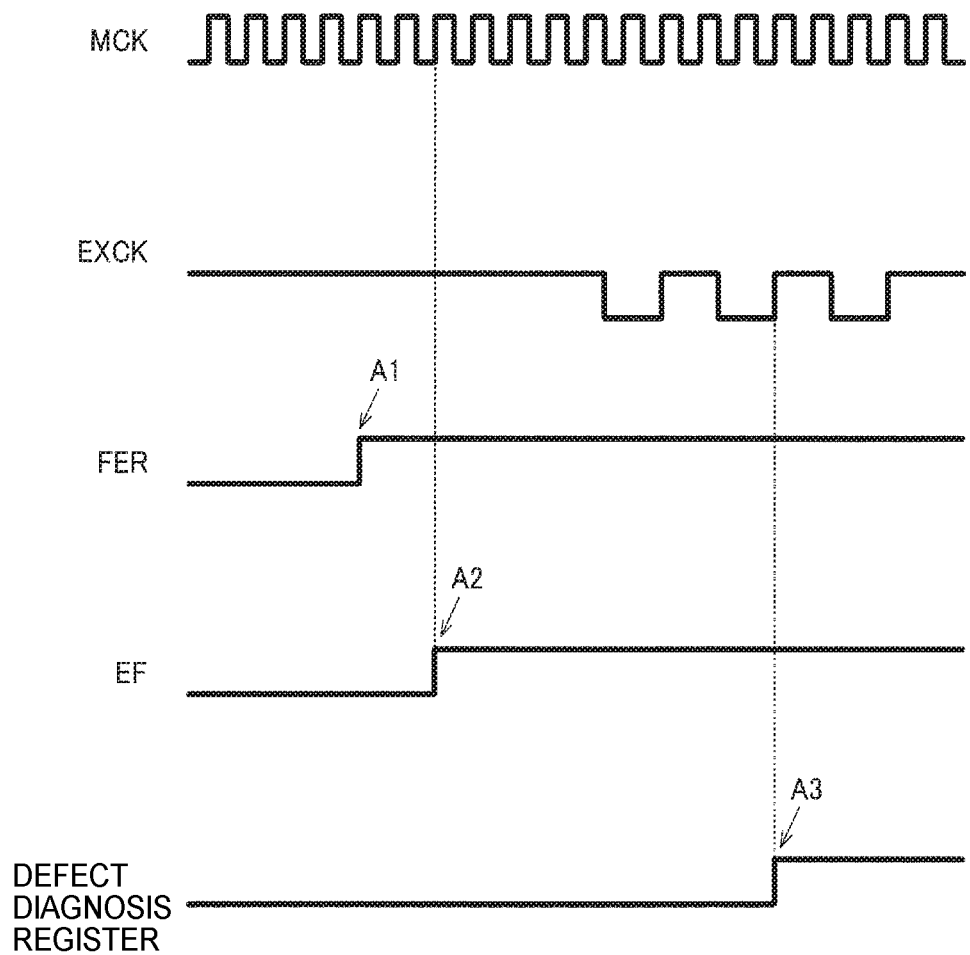
FIG. 2 is a timing chart illustrating operations of a defect diagnosis circuit and an interface circuit.

Hereinafter, the operation of the circuit device 20 according to this embodiment will be described. FIG. 2 is a timing chart illustrating operations of the defect diagnosis circuit 160 and the interface circuit 130. Meanwhile, a timing chart of error information EF is a timing chart of an error signal corresponding to the error information EF.

As indicated by A1 of FIG. 2, it is assumed that a failure detection signal FER changes from a non-active state (low level, a first logic level in a broad sense) to an active state (high level, a second logic level in a broad sense). Meanwhile, the failure detection signal FER changes in synchronization with, for example, the master clock signal MCK (for example, in synchronization with a rising edge), but is not limited thereto. For example, a failure detection signal from an analog circuit, and the like may change asynchronously with the master clock signal MCK.

As indicated by A2, the register unit 162 of the defect diagnosis circuit 160 takes up the failure detection signal FER by the master clock signal MCK, and outputs the taken-up signal as the error information EF. For example, the failure detection signal FER is taken up at a second rising edge of the master clock signal MCK after the failure detection signal FER is set to be in an active state.

As indicated by A3, the failure diagnosis resister 138 of the interface circuit 130 takes up the error information EF by the external clock signal EXCK. For example, the error information EF is taken up at a second rising edge of the external clock signal EXCK after an error signal corresponding to the error information EF is set to be in an active state. In a case where a request for reading out the error information EF is made by the external device 200, the error information EF stored in the failure diagnosis resister 138 is output to the external device 200.

Figure 3:
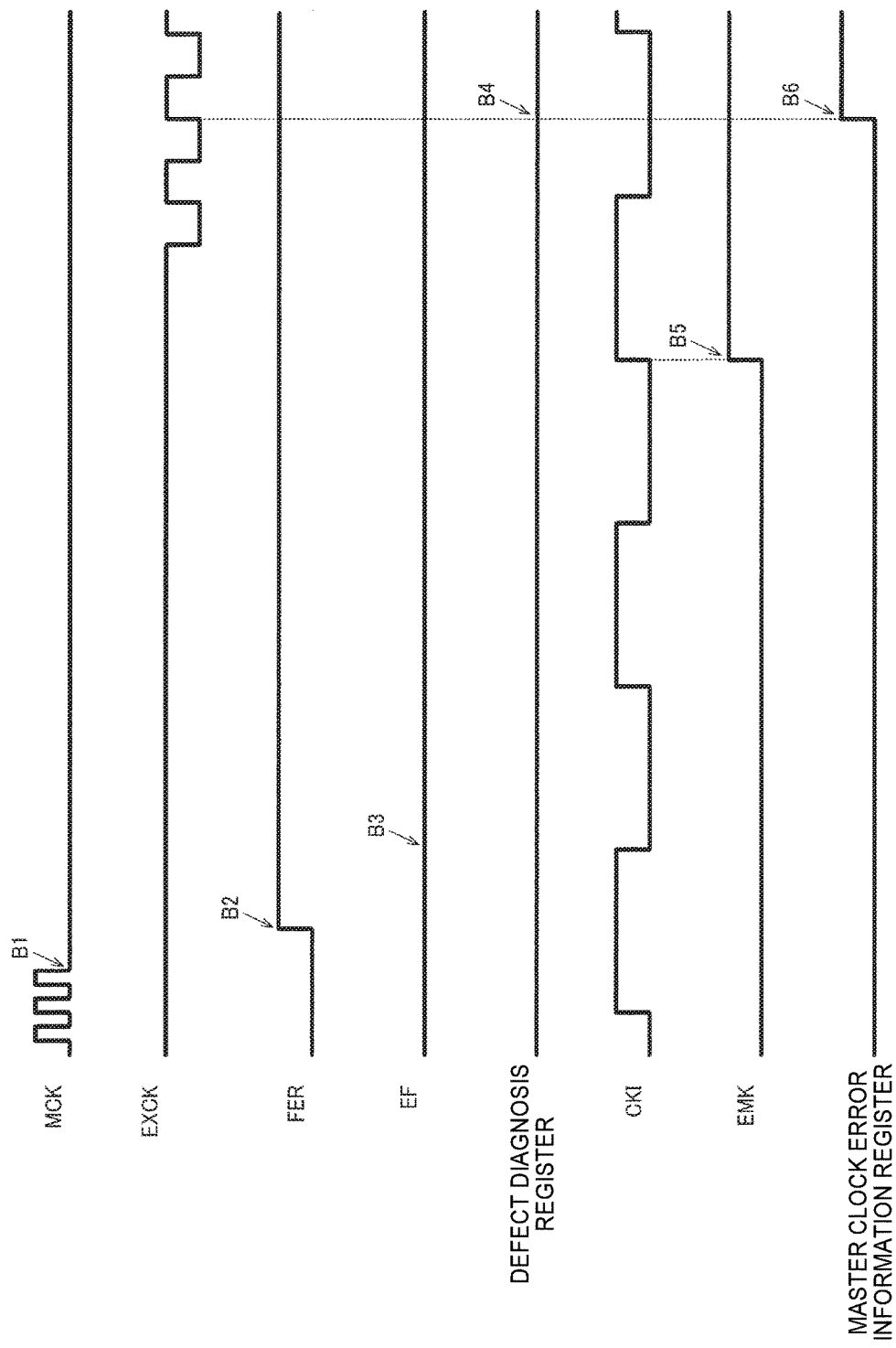
FIG. 3 is a timing chart illustrating operations of a master clock signal failure detection circuit, the defect diagnosis circuit, and the interface circuit.

FIG. 3 is a timing chart illustrating operations of the master clock signal failure detection circuit 150, the defect diagnosis circuit 160, and the interface circuit 130 in a case where a failure occurs in the master clock signal MCK. Meanwhile, timing charts of the error information EF and EMK are timing charts of error signals corresponding to the error information EF and EMK.

As indicated by B1 of FIG. 3, it is assumed that the master clock signal MCK is stopped (set to be in a non-active state) due to the occurrence of a failure. As indicated by B2, a case is considered in which the failure detection signal FER is set to be in an active state after the master clock signal MCK is stopped. In this case, as indicated by B3, the register unit 162 of the defect diagnosis circuit 160 does not take up the failure detection signal FER due to the stop state of the master clock signal MCK, and the error signal corresponding to the error information EF is not set to be in an active state. Therefore, as indicated by B4, an active error signal (error information EF) is not taken up in the failure diagnosis resister 138 even when a rising edge of the external clock signal EXCK comes, and an error is not notified to the external device 200.

In this manner, in a case where the error information EF is output on the basis of the master clock signal MCK, there is a possibility that error information cannot be transmitted to the external device 200 when the master clock signal MCK is stopped. In addition, the stop of the master clock signal MCK results in a failure state such as the stop of a large number of functions of the circuit device 20, but the external device 200 cannot know the state from error information.

Consequently, in this embodiment, as indicated by B5, the master clock signal failure detection circuit 150 operates by an error detection clock signal CKI which is independent of the master clock signal MCK, and outputs the error information EMK. Specifically, in a case where a predetermined number of pulses of the error detection clock signal CKI is input after the master clock signal MCK is stopped, an error signal corresponding to the error information EMK is set to be in an active state. FIG. 3 illustrates a case where an error signal corresponding to the error information EMK is set to be in an active state at a second rising edge of the error detection clock signal CKI after the master clock signal MCK is stopped. However, the invention is not limited thereto, and the predetermined number may be a number other than 2. As indicated by B6, the master clock error information register 136 takes up the error information EMK by the external clock signal EXCK. For example, the error information EMK is taken up at a second rising edge of the external clock signal EXCK after an error signal corresponding to the error information EMK is set to be in an active state. In a case where a request for reading out the error information EMK is made by the external device 200, the error information EMK stored in the master clock error information register 136 is output to the external device 200. The external device 200 can perform processing such as the reset (the restarting up) of the circuit device 20 on the basis of the error information EMK. Meanwhile, in a case where the circuit device 20 performs a process of monitoring a value stored in the master clock error information register 136 at regular intervals on the basis of a clock signal different from a master clock to thereby set error information EMK indicating that a failure occurs in the master clock error information register 136, the circuit device 20 may perform processing such as the reset (the restarting up) of the circuit device itself.

According to this embodiment described above, the circuit device 20 includes the control circuit 110 that operates on the basis of the master clock signal MCK, and the interface circuit 130 that includes the register unit 134 and transmits the data SDT to the outside on the basis of the external clock signal EXCK which is input from the outside. The register unit 134 takes up the error information EMK of the master clock signal MCK on the basis of the external clock signal EXCK, and stores the taken-up error information EMK. The interface circuit 130 transmits the data SDT including the error information EMK stored in the register unit 134 to the outside.

In this manner, even when a failure occurs in the master clock signal MCK, it is possible to transmit the error information EMK for giving a notice of the failure to the external device 200. That is, as described above, in a case where the master clock signal MCK is set to be in a failure state, it is difficult to transmit an error of the circuit device 20 to the external device 200. In this respect, in this embodiment, the interface circuit 130 includes the register unit 134 that stores the error information EMK of the master clock signal MCK, and thus it is possible to transmit the error information EMK to the external device 200. Thereby, the external device 200 can know at least a failure of the master clock signal MCK, and can perform an operation corresponding to the error.

In addition, in this embodiment, the circuit device 20 includes the master clock signal failure detection circuit 150 that detects a failure of the master clock signal MCK. The master clock signal failure detection circuit 150 outputs error information EMK indicating that the master clock signal MCK is in a failure state to the register unit 134 in a case where a failure of the master clock signal MCK is detected.

The error information EMK corresponds to an error signal. The setting of the error signal corresponding to the error information EMK to be in an active state corresponds to the output of the error information EMK indicating that the master clock signal MCK is set to be in a failure state.

In this manner, in a case where the master clock signal failure detection circuit 150 detects a failure of the master clock signal MCK, the error information EMK is set to be information indicating that the master clock signal MCK is set to be in a failure state, and the error information EMK is taken into the register unit 134 on the basis of the external clock signal EXCK. Thereby, it is possible to transmit the error information EMK indicating that the master clock signal MCK is set to be in a failure state, to the external device 200.

In addition, in this embodiment, the register unit 134 takes up the error information EMK from the master clock signal failure detection circuit 150, on the basis of the external clock signal EXCK.

In this manner, the error information EMK is taken into the register unit 134 on the basis of the external clock signal EXCK which is supplied independently of the master clock signal MCK. Thereby, even when the master clock signal MCK is set to be in a failure state, it is possible to transmit the error information EMK to the external device 200.

In addition, in this embodiment, the master clock signal failure detection circuit 150 detects a failure of the master clock signal MCK and outputs the error information EMK to the register unit 134, on the basis of the error detection clock signal CKI which is a clock signal different from the master clock signal MCK.

As described in FIG. 3, the defect diagnosis circuit 160 operating by the master clock signal MCK is stopped operating in a case where the master clock signal MCK is set to be in a failure state, and cannot set an error signal corresponding to the error information EF to be in an active state even when a failure occurs in the circuit. In this respect, in this embodiment, it is possible to detect a failure of the master clock signal MCK on the basis of the error detection clock signal CKI different from (that is, independent of) the master clock signal MCK. In addition, it is possible to output the error information EMK to the register unit 134 on the basis of the error detection clock signal CKI. Thereby, in a case where a failure occurs in the master clock signal MCK, it is possible to set an error signal corresponding to the error information EMK indicating the occurrence of a failure to be in an active state and to output the error signal to the register unit 134.

In addition, in this embodiment, the circuit device 20 may include a driving circuit that oscillates (drives) a vibrator. The error detection clock signal CKI may be a clock signal which is generated by oscillating the vibrator.

The vibrator is a vibrator in a case of being used as a physical quantity transducer. The driving circuit is a circuit for setting a state where the vibrator outputs a detection signal corresponding to a physical quantity, by supplying a driving signal to the vibrator to thereby oscillate the vibrator. A clock signal generated by oscillating the vibrator is, for example, an oscillation signal which is output from a terminal of the vibrator, an internal signal of the driving circuit in a case where the driving circuit oscillates the vibrator, or the like. For example, in the physical quantity detection device 300 to be described later in FIG. 13, an angular velocity detection element 13 detecting a Coriolis force corresponds to the vibrator. A synchronization signal SYCA (signal for the detection circuit 60 to perform synchronous) which is output by the driving circuit 30 corresponds to the clock signal which is generated by oscillating the vibrator.

In this manner, in a case where the circuit device 20 includes a driving circuit that drives a vibrator, a clock signal generated by oscillating the vibrator is present within the circuit device 20. The clock signal is used as the error detection clock signal CKI, and thus it is possible to monitor the master clock signal MCK by a clock signal which is independent of the master clock signal MCK. In addition, a clock signal which is already present is used, and thus it is not necessary to redundantly provide a clock signal generation circuit.

Meanwhile, the error detection clock signal CKI of this embodiment may be a clock signal different from the master clock signal MCK, and is not limited to being a clock signal generated by driving a physical quantity transducer. For example, the circuit device 20 includes a clock signal generation circuit different from the circuit generating the master clock signal MCK (for example, the master clock signal generation circuit 120 of FIG. 4 or a master clock signal generation circuit provided outside the circuit device 20), and may use a clock signal generated by the clock signal generation circuit as the error detection clock signal CKI. Alternatively, the error detection clock signal CKI may be a clock signal generated by oscillating a vibrator of an oscillator that generates an oscillation signal (reference frequency signal). For example, in the oscillator 500 to be described later in FIG. 16, the circuit device 20 (20*b*) includes an oscillation circuit 550 that oscillates a vibrator XTAL, and the oscillation signal OSCK from the oscillation circuit 550 corresponds to the error detection clock signal CKI.

In addition, as described later in FIG. 7 and the like, the master clock signal failure detection circuit 150 may include a first flip flop circuit 151, a second flip flop circuit 152, an exclusive OR circuit 154, and a counter 155. The first flip flop circuit 151 latches an input clock signal based on the master clock signal MCK, on the basis of the error detection clock signal CKI. The second flip flop circuit 152 latches a first output signal QF1 from the first flip flop circuit 151, on the basis of the error detection clock signal CKI. The exclusive OR circuit 154 obtains an exclusive OR of the first output signal QF1 and a second output signal QF2 from the second flip flop circuit 152. The counter 155 counts a period of time (period of time of N CKI pulses of FIG. 9) in which an output signal QXR of the exclusive OR circuit 154 is set to be a first logic level (low level), on the basis of the error detection clock signal CKI, and outputs the error information EMK indicating that the master clock signal MCK is set to be in a failure state in a case where a counted value is set to be a predetermined value (N).

Here, the input clock signal based on the master clock signal MCK may be the master clock signal MCK itself, or may be a clock signal generated based on the master clock signal MCK. For example, in the example of FIG. 7, the input clock signal is a frequency-divided clock signal DMK obtained by performing frequency division of the master clock signal MCK.

The master clock signal failure detection circuit 150 is configured in this manner, and thus it is possible to detect the stop of the master clock signal MCK in a case where the master clock signal MCK is stopped. That is, when the logic level of the master clock signal MCK does not change, the logic level of an output signal QXR of the exclusive OR circuit 154 does not change. In a case where the counter 155 detects that the unchanged state of the logic level is continued for a predetermined period of time, the counter sets the error information EMK to be information indicating that the master clock signal MCK is set to be in a failure state (sets an error signal to be in an active state).

In addition, in this embodiment, the circuit device 20 includes the defect diagnosis circuit 160 that operates by the master clock signal MCK. The register unit 134 includes the failure diagnosis resister 138 that takes up the error information EF from the defect diagnosis circuit 160.

In a case where the defect diagnosis circuit 160 operates on the basis of the master clock signal MCK in this manner, the operation of the defect diagnosis circuit 160 is stopped in a case where the master clock signal MCK is set to be in a failure state. Then, an error signal corresponding to the error information EF is not set to be in an active state even when an error occurs in the circuit device 20, and correct error information EF is not taken into the failure diagnosis resister 138, and thus an error is not notified to the external device 200. In this respect, in this embodiment, it is possible to notify the external device 200 that at least the master clock signal MCK is set to be in a failure state.

In addition, in this embodiment, the interface circuit 130 is an interface circuit of a serial peripheral interface (SPI) system or an inter-integrated circuit (I2C) system.

The SPI system is a synchronous serial communication system in which communication is performed by a serial clock line and two unidirectional serial data lines. A plurality of slaves can be connected to a bus of an SPI, but a master needs to select a slave by using a slave select line in order to specify the slaves. In the example to be described later in FIG. 11, the serial clock signal SCK corresponds to the external clock signal EXCK, and reception serial data MOSI and transmission serial data MISO correspond to the data SDT. The I2C system is a synchronous serial communication system in which communication is performed by a serial clock line and two signal lines of bidirectional serial data lines. A plurality of slaves can be connected to a bus of the I2C, and a master designates addresses of slaves which are individually determined to select a slave and then performs communication with the slave. In this case, a serial clock signal transmitted by the serial clock line corresponds to the external clock signal EXCK, and serial data transmitted by the bidirectional serial data line corresponds to the data SDT.

In such serial interfaces of two, three, and four lines, communication is performed using a serial clock line. In this embodiment, error information EMK of the master clock signal MCK is taken into the register unit 134 by a serial clock signal which is input from the serial clock line. Thereby, it is possible to transmit the error information EMK of the master clock signal MCK to the external device 200 through a serial interface.

Figure 13:
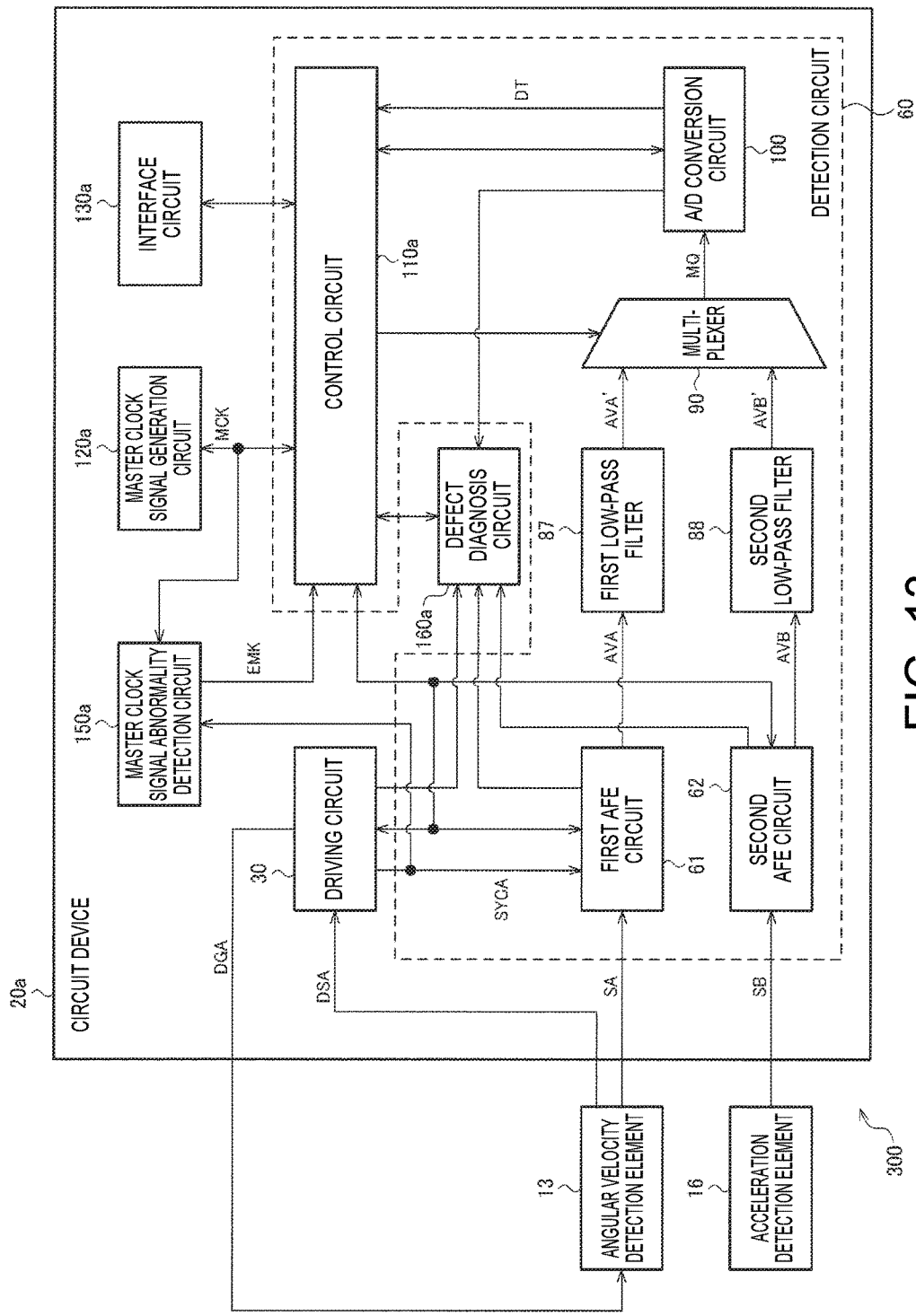
FIG. 13 illustrates an example of detailed configurations of a physical quantity detection device and a circuit device which is applied to the physical quantity detection device.

In addition, in this embodiment, as described later in FIG. 13 and the like, the circuit device 20 (20*a*) may be applied to the physical quantity detection device 300. The physical quantity detection device 300 includes the circuit device 20 (20*a*) and a physical quantity transducer. In the example of FIG. 13, the physical quantity transducer is at least one of the angular velocity detection element 13 and the acceleration detection element 16. In addition, in a case where the physical quantity transducer is the angular velocity detection element 13, for example, the physical quantity transducer is a vibrator (angular velocity detection element that detects a Coriolis force).

In the physical quantity detection device that detects a physical quantity, digital signal processing may be performed in a process of detecting a physical quantity. In this case, a logic circuit performing the digital signal processing operates by a master clock signal. As the master clock signal, for example, a clock signal obtained by driving (oscillating) a vibrator which is an angular velocity detection element included in the physical quantity detection device may be used. However, an operation frequency of a logic circuit within a circuit device included in the physical quantity detection device is limited by a driving frequency. In addition, the circuit device of the physical quantity detection device is operated using only the clock signal obtained by driving the vibrator, and thus the function of the circuit device is stopped in a case where a failure occurs in the clock signal.

In this respect, in this embodiment, a logic circuit (control circuit 110) operates by the master clock signal MCK which is a clock signal different from a clock signal obtained by driving (oscillating) a vibrator. For example, as described later in FIG. 4, the circuit device 20 includes the master clock signal generation circuit 120, and the logic circuit operates by the master clock signal MCK generated by the master clock signal generation circuit 120. Thereby, it is possible to operate the logic circuit at high speed without depending on the driving frequency of the vibrator, and the like. In addition, two independent clock signals of the master clock signal MCK and the clock signal obtained by driving the vibrator are present, and thus there is a possibility that it is possible to maintain at least a portion of the functions of the circuit device 20 even when a failure occurs in any one clock signal. The master clock signal MCK is monitored by the clock signal obtained by driving the vibrator, and thus it is possible to detect a failure of the master clock signal MCK and to notify the external device 200 of the detected failure.

Figure 4:
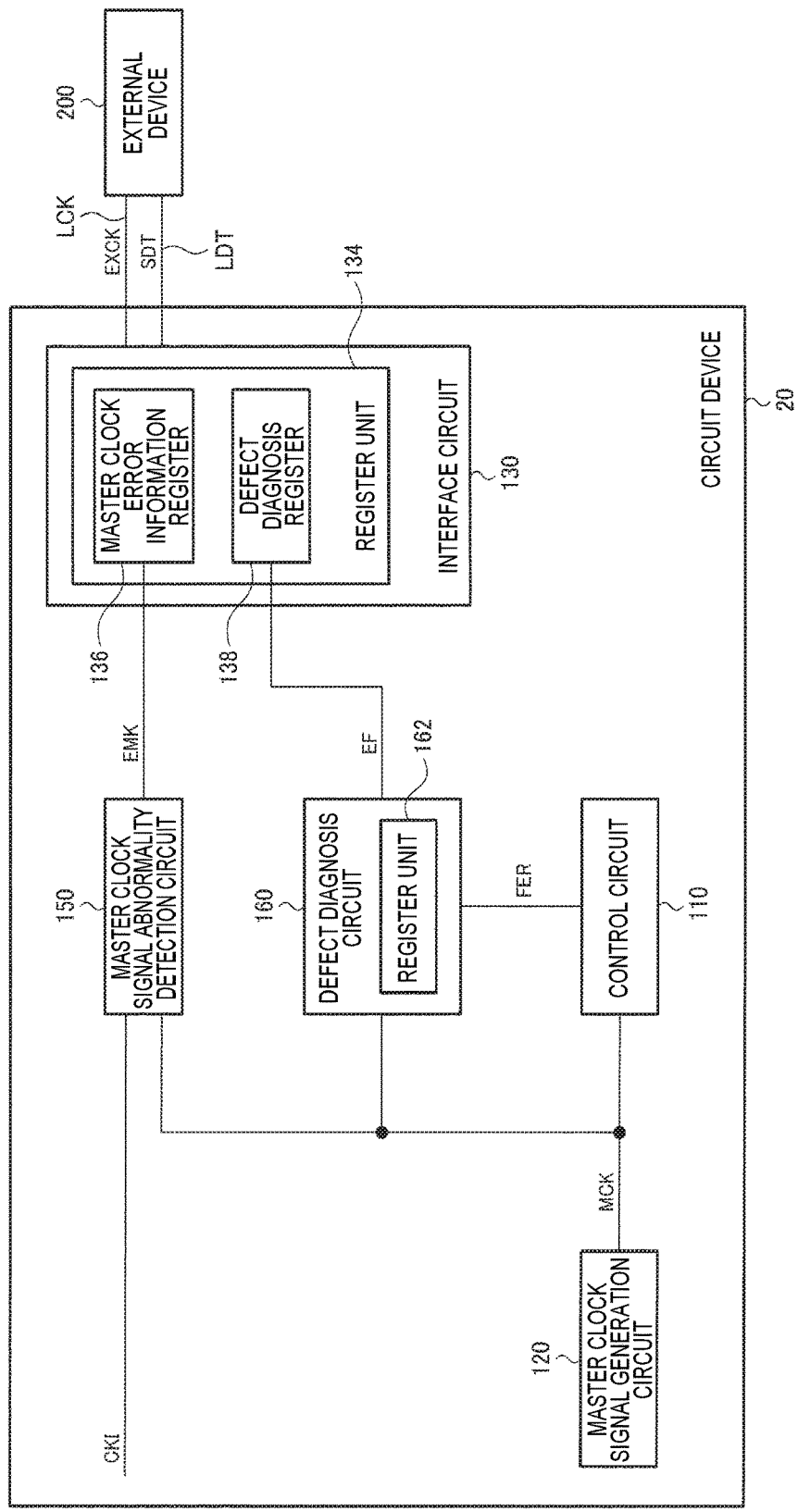
FIG. 4 illustrates an example of a second configuration of the circuit device according to this embodiment.

Meanwhile, in a case where the physical quantity detection device 300 includes only the acceleration detection element 16 out of the angular velocity detection element 13 and the acceleration detection element 16, the error detection clock signal CKI is, for example, a clock signal from a clock signal generation circuit which is provided separately from the circuit generating the master clock signal MCK (for example, the master clock signal generation circuit 120 of FIG. 4 or a master clock signal generation circuit provided outside the circuit device 20). Alternatively, the circuit device 20 may include a driving circuit that vibrates (drives) the acceleration detection element 16 at a frequency of a carrier wave, and a clock signal which is output by the driving circuit may be used as the error detection clock signal CKI.

The configuration of the circuit device 20 of this embodiment is not limited to that illustrated in FIG. 1. For example, the circuit device 20 may be configured as in the following examples of second to fourth configurations.

FIG. 4 illustrates an example of the second configuration of the circuit device 20 of this embodiment. In FIG. 4, the circuit device 20 further includes the master clock signal generation circuit 120 that generates the master clock signal MCK, as compared to FIG. 1.

The master clock signal generation circuit 120 is, for example, an oscillation circuit that generates the master clock signal MCK without using a vibrator, or is an oscillation circuit that generates the master clock signal MCK by using a vibrator. The oscillation circuit that does not use a vibrator is, for example, a multi-vibrator that oscillates by switching between two states, a ring oscillator that connects an odd number of inversion circuits (circuits having a negative gain) in the form of a ring, a CR oscillation circuit that feeds back an output of an inversion circuit by a CR circuit (circuit constituted by a capacitor and a resistor), or the like. The oscillation circuit using a vibrator is, for example, an oscillation circuit that drives and oscillates a quartz crystal vibrator, a ceramic vibrator, or the like. Meanwhile, a portion of the oscillation circuit which is built into the circuit device 20 may be the master clock signal generation circuit 120, and a portion (for example, a capacitor or the like) of components constituting the oscillation circuit or a vibrator may be provided outside the circuit device 20.

Figure 5:
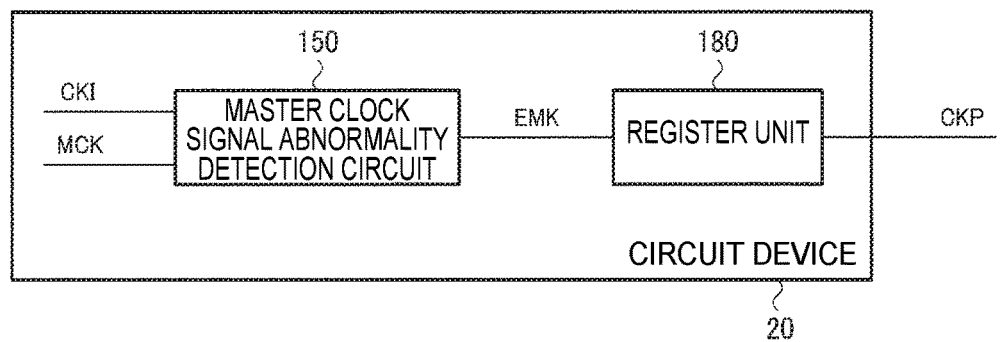
FIG. 5 illustrates an example of a third configuration of the circuit device according to this embodiment.

FIG. 5 illustrates an example of the third configuration of the circuit device 20 according to this embodiment. The circuit device 20 of FIG. 5 includes the master clock signal failure detection circuit 150 and a register unit 180.

The master clock signal failure detection circuit 150 detects a failure of the master clock signal MCK. Specifically, in a case where the master clock signal failure detection circuit 150 detects a failure of the master clock signal MCK, the master clock signal failure detection circuit outputs error information EMK, indicating that the master clock signal MCK is set to be in a failure state, to the register unit 180. The master clock signal failure detection circuit 150 detects a failure of the master clock signal MCK on the basis of an error detection clock signal CKI which is a clock signal different from the master clock signal MCK, and outputs the error information EMK to the register unit 180.

The register unit 180 takes up the error information EMK of the master clock signal MCK on the basis of an external clock signal CKP which is input from the outside of the circuit device 20. For example, the register unit 180 includes a flip flop circuit (register for master clock error information) which has a clock terminal to which the external clock signal CKP is input, and the flip flop circuit takes up the error information EMK. For example, the external clock signal CKP is an external clock signal EXCK which is supplied from the external device 200 of FIG. 1, but is not limited thereto. That is, the external clock signal CKP may be a clock signal different from (independent of) the master clock signal MCK or the error detection clock signal CKI.

The circuit device 20 of FIG. 5 may further include an interface circuit that transmits data including the error information EMK stored in the register unit 180 to the outside on the basis of the external clock signal CKP. In this case, the register unit 180 may be included in the interface circuit similar to FIG. 1, or may be provided separately from the interface circuit.

According to the above-described examples of the second and third configurations, even when a failure occurs in the master clock signal MCK, the error information EMK for giving notice of the failure can be taken up in a register unit (134, 180) on the basis of an external clock signal (EXCK, CKP). Thereby, it is possible to transmit the error information EMK of the master clock signal MCK to the outside (for example, the external device 200).

Figure 6:
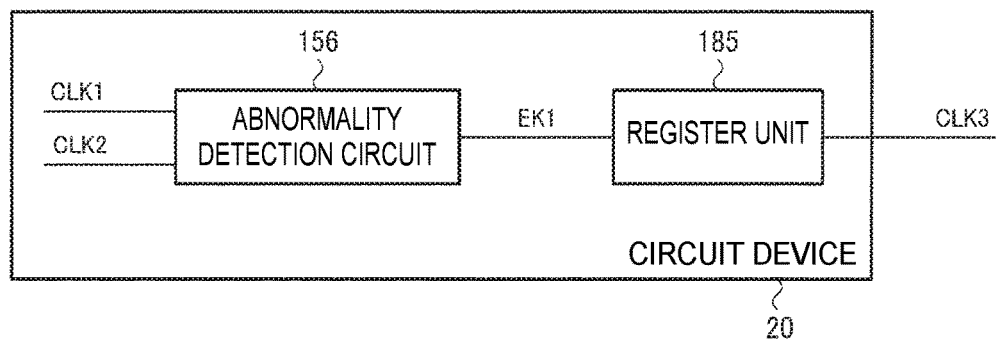
FIG. 6 illustrates an example of a fourth configuration of the circuit device according to this embodiment.

FIG. 6 illustrates an example of the fourth configuration of the circuit device 20 of this embodiment. The circuit device 20 of FIG. 6 includes a failure detection circuit 156 and a register unit 185.

The failure detection circuit 156 detects a failure of a first clock signal CLK1 on the basis of a second clock signal CLK2 different from the first clock signal CLK1. For example, although the first clock signal CLK1 corresponds to the master clock signal MCK of FIG. 1 and the second clock signal CLK2 corresponds to the error detection clock signal CKI of FIG. 1, the invention is not limited thereto. That is, the first clock signal CLK1 may be a clock signal which is used for the operation of the circuit device 20, and is not limited to a clock signal which is used for the operation of a logic circuit. The first clock signal CLK1 and the second clock signal CLK2 may be clock signals that are different from each other (independent of each other). For example, in a case where the circuit device 20 is applied to an angular velocity sensor as in FIG. 14, a signal SYC from the driving circuit 30 driving the vibrator 10 may correspond to the first clock signal CLK1, and the second clock signal CLK2 maybe the master clock signal MCK which is used for the operation of the control circuit 110.

The register unit 185 takes up error information EK1 of the first clock signal CLK1 on the basis of a third clock signal CLK3 which is an external clock signal input from the outside of the circuit device 20. For example, the register unit 185 includes a flip flop circuit (register for clock error information) which has a clock terminal to which the third clock signal CLK3 is input, and the flip flop circuit takes up the error information EK1. For example, the third clock signal CLK3 is an external clock signal EXCK which is supplied from the external device 200 of FIG. 1, but is not limited thereto. That is, the third clock signal CLK3 may be a clock signal different from (independent of) the first clock signal CLK1 or the second clock signal CLK2.

The circuit device 20 of FIG. 6 may further include an interface circuit that transmits data including the error information EK1 stored in the register unit 185 to the outside on the basis of the third clock signal CLK3. In this case, the register unit 185 may be included in the interface circuit similar to FIG. 1, or may be provided separately from the interface circuit.

According to the above-described example of the fourth configuration, in a case where the first clock signal CLK1 and the second clock signal CLK2, which are independent of each other, are present in the circuit device 20, it is possible to detect a failure of the first clock signal CLK1 by the second clock signal CLK2. It is possible to take up the error information EK1 of the first clock signal CLK1 in the register unit 185 by further using the independent third clock signal CLK3. Thereby, it is possible to transmit the error information EK1 of the first clock signal CLK1 to the outside (for example, the external device 200).

Meanwhile, the above-described operation of the circuit device 20 can be performed as a method of detecting a failure of a master clock signal (method of operating a circuit device). That is, a failure of the master clock signal MCK is detected by a clock signal (for example, CKI) other than the master clock signal MCK, the error information EMK of the master clock signal MCK is taken up in a register unit (134, 180) on the basis of an external clock signal (for example, EXCK, CKP) which is input from the outside, and data including the error information EMK stored in the register unit is transmitted to the outside on the basis of the external clock signal.

Such a failure detection method is performed by the circuit device 20, and thus it is possible to take up the error information EMK for giving notice of a failure in a register unit (134, 180) on the basis of an external clock signal (EXCK, CKP) even when the failure occurs in the master clock signal MCK. Thereby, it is possible to transmit the error information EMK of the master clock signal MCK to the outside (for example, the external device 200).

2. Master Clock Signal Failure Detection Circuit

Figure 7:
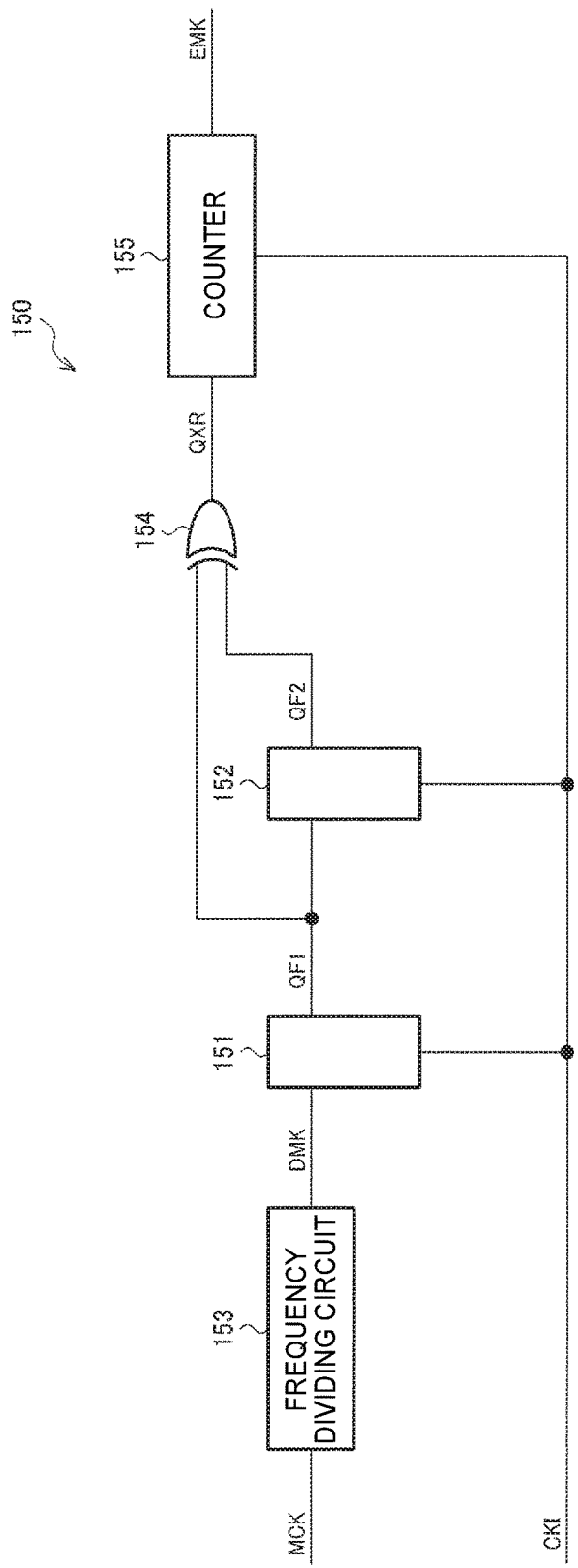
FIG. 7 illustrates an example of a detailed configuration of the master clock signal failure detection circuit.

FIG. 7 illustrates an example of a detailed configuration of the master clock signal failure detection circuit 150. The master clock signal failure detection circuit 150 includes a frequency dividing circuit 153, the first flip flop circuit 151, the second flip flop circuit 152, an exclusive OR circuit 154 (XOR circuit), and the counter 155.

Figure 8:
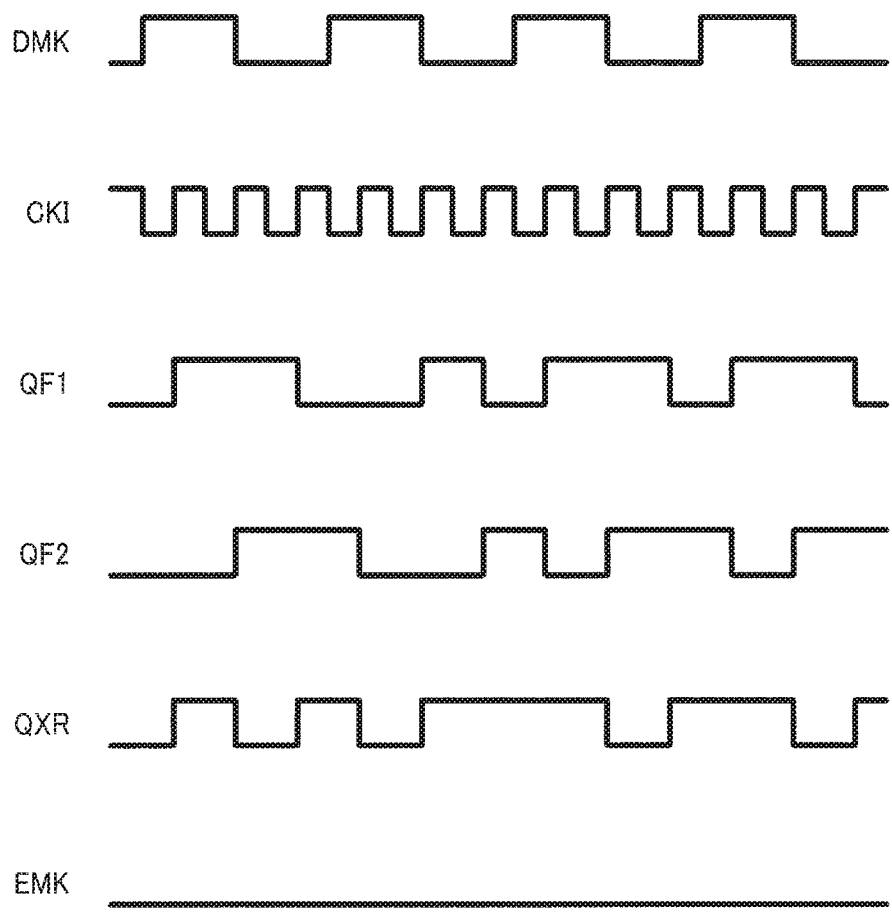
FIG. 8 is a timing chart illustrating operations of the master clock signal failure detection circuit in a case where a master clock signal is not stopped.

FIG. 8 is a timing chart illustrating operations of the master clock signal failure detection circuit 150 in a case where the master clock signal MCK is not stopped. Meanwhile, a timing chart of the error information EMK is a timing chart of an error signal corresponding to the error information EMK.

The frequency dividing circuit 153 performs frequency division of the master clock signal MCK, and outputs the master clock signal MCK obtained by the frequency division as a frequency-divided clock signal DMK. The first flip flop circuit 151 takes up the frequency-divided clock signal DMK (at a rising edge) on the basis of the error detection clock signal CKI. The second flip flop circuit 152 takes up an output signal QF1 of the first flip flop circuit 151 (at a rising edge) on the basis of the error detection clock signal CKI. The exclusive OR circuit 154 obtains an exclusive OR of the output signal QF1 of the first flip flop circuit 151 and an output signal QF2 of the second flip flop circuit 152, and outputs the result as a signal QXR.

The counter 155 performs a counting operation on the basis of the error detection clock signal CKI. Specifically, a counted value is reset (set to zero) in a case where the signal QXR is set to be a high level (second logic level in a broad sense). In a case where the signal QXR has a low level (first logic level in a broad sense), the counted value is incremented when a pulse (for example, a rising edge) of the error detection clock signal CKI is input. The counter 155 sets an error signal corresponding to the error information EMK to be in an active state in a case where the counted value is set to be a predetermined value. In a case where a failure does not occur in the master clock signal MCK as in FIG. 8, the signal QXR is not fixed to a low level, and thus an error signal corresponding to the error information EMK is not set to be in an active state.

Figure 9:
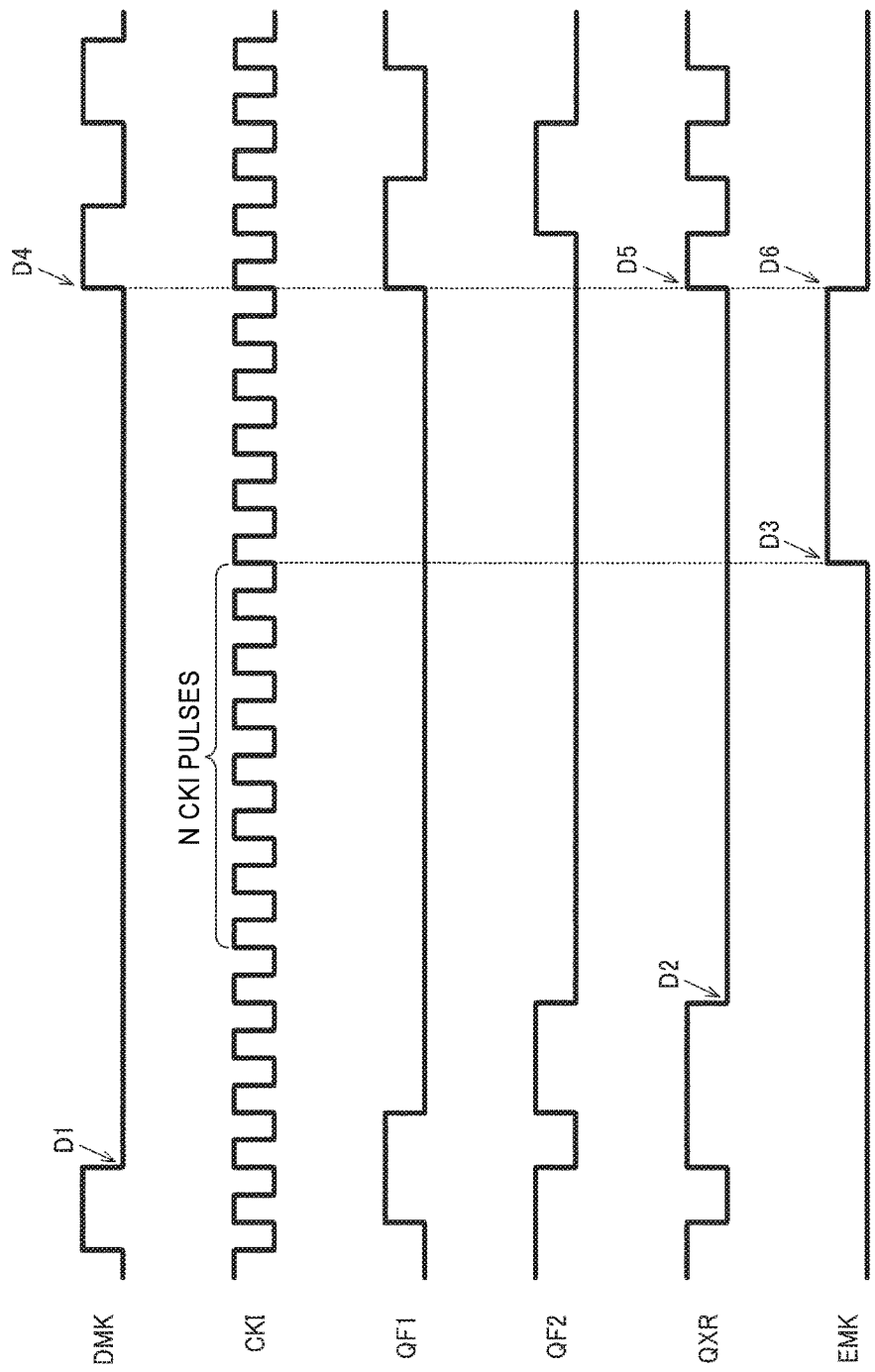
FIG. 9 is a timing chart illustrating operations of the master clock signal failure detection circuit in a case where a master clock signal is stopped.

FIG. 9 is a timing chart illustrating operations of the master clock signal failure detection circuit 150 in a case where the master clock signal MCK is stopped. Meanwhile, a timing chart of the error information EMK is a timing chart of an error signal corresponding to the error information EMK.

As indicated by D1 of FIG. 9, in a case where the master clock signal MCK is stopped, the frequency-divided clock signal DMK is also stopped (for example, fixed to a low level). Then, as indicated by D2, the output signal QXR of the exclusive OR circuit 154 does not change and keeps a low level. The signal QXR at a high level is not input to the counter 155, and thus the counted value is not reset. For this reason, as indicated by D3, when the counted value is set to be a predetermined value N=8, an error signal corresponding to the error information EMK is set to be in an active state. Meanwhile, the relation of N=8 is established here. However, the invention is not limited thereto, and N may be any integer of 1 or greater (for example, N≥4).

As indicated by D4, in a case where the master clock signal MCK returns from the stop state, the frequency-divided clock signal DMK is also returned. As indicated by D5, the output signal QXR of the exclusive OR circuit 154 changes, and thus the counted value of the counter 155 is reset when the signal QXR is set to be a high level. Then, as indicated by D6, an error signal corresponding to the error information EMK changes from an active state to a non-active.

3. Master Clock Signal Generation Circuit

Figure 10:
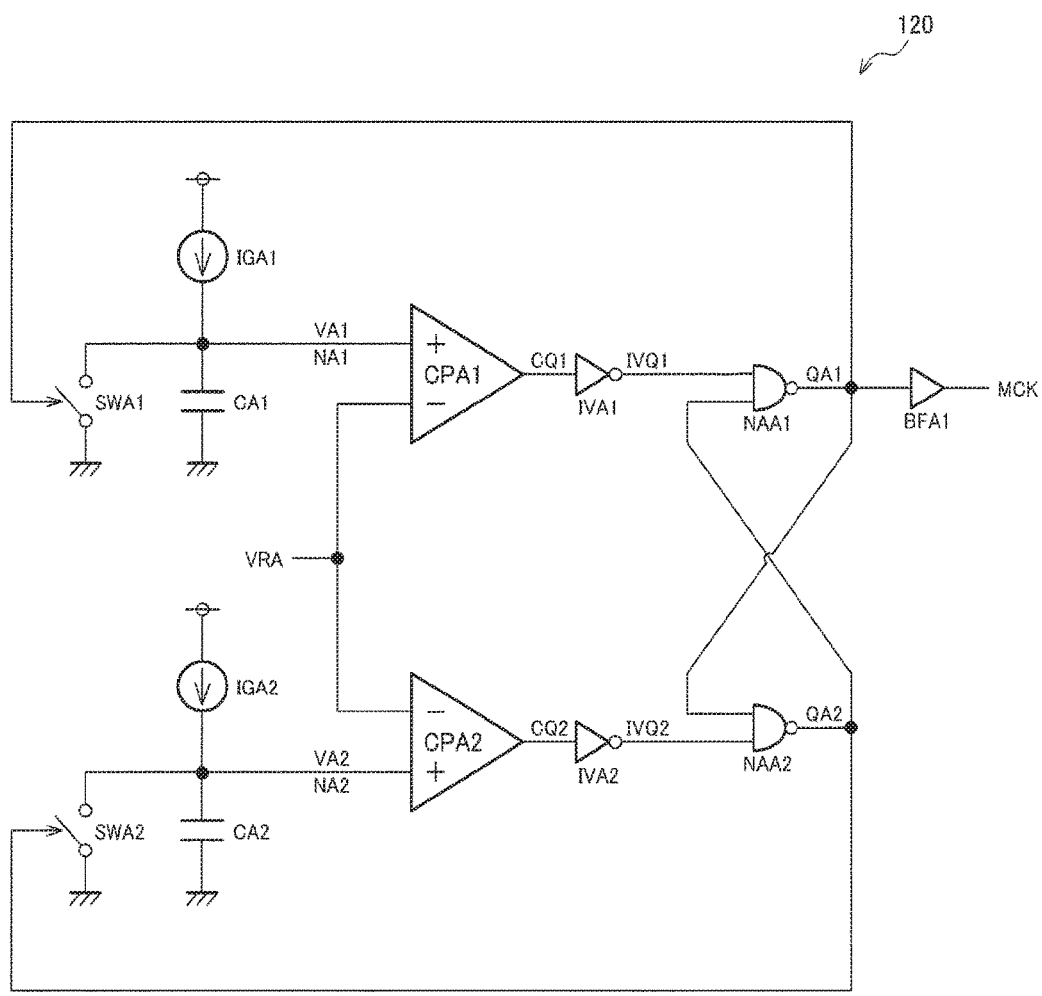
FIG. 10 illustrates an example of a detailed configuration of a master clock signal generation circuit.

FIG. 10 illustrates an example of a detailed configuration of the master clock signal generation circuit 120. Meanwhile, hereinafter, a multi-vibrator will be described as an example. However, the master clock signal generation circuit 120 is not limited to the multi-vibrator, and it is possible to adopt various oscillation circuits described above.

The master clock signal generation circuit 120 of FIG. 10 includes switch elements SWA1 and SWA2, current sources IGA1 and IGA2 (bias current output circuits), capacitors CA1 and CA2, comparators CPA1 and CPA2, logic inverting circuits IVA1 and IVA2 (inverters), NAND circuits NAA1 and NAA2 (NAND circuits), and a buffer BFA1. The switch elements SWAT and SWA2 are, for example, transistors. The buffer BFA1 is a circuit that outputs the same logic level as an input. Meanwhile, a reference voltage VRA which is input to the comparators CPA1 and CPA2 is a voltage which is higher than a ground voltage (low-potential side power supply voltage).

The master clock signal generation circuit 120 oscillates by switching a state between a first state and a second state described below.

In the first state, the master clock signal MCK has a low level. In this case, an output signal QA1 of the NAND circuit NAA1 has a low level, and an output signal QA2 of the NAND circuit NAA2 has a high level.

The output signal QA2 has a high level, and thus the switch element SWA2 is turned on. The switch element SWA2 is turned on, and thus a node NA2 of one end of the capacitor CA2 is short-circuited to a ground (low-potential side power supply), and a voltage VA2 of the node NA2 is set to be a ground voltage. The comparator CPA2 compares the voltage VA2 and a reference voltage VRA with each other. In a case where the voltage VA2 is smaller than the reference voltage VRA, an output signal CQ2 of the comparator CPA2 has a low level. An output signal IVA2 of the logic inverting circuit IVA2 has a high level.

In addition, the output signal QA1 has a low level, and thus the switch element SWA1 is turned off. Since the switch element SWA1 is turned off, a current (electric charge) from the current source IGA1 is accumulated in the capacitor CA1, and a voltage VA1 of a node NA1 increases. The comparator CPA1 compares the voltage VA1 and the reference voltage VRA with each other. When the voltage VA1 becomes larger than the reference voltage VRA, an output signal CQ1 changes from a low level to a high level. Then, an output signal IVQ1 of the logic inverting circuit IVA1 changes from a high level to a low level, and the output signal QA1 of the NAND circuit NAM changes from a low level to a high level, thereby allowing the state to proceed to the second state.

In the second state, the master clock signal MCK has a high level. In this case, the output signal QA1 of the NAND circuit NAM has a high level, and the output signal QA2 of the NAND circuit NAA2 has a low level.

The output signal QA1 has a high level, and thus the switch element SWA2 is turned on. Since the switch element SWA1 is turned on, a node NA1 of one end of the capacitor CA1 is short-circuited to a ground (low-potential side power supply), and a voltage VA1 of the node NA1 is set to be a ground voltage. In a case where the voltage VA1 is smaller than the reference voltage VRA, the output signal CQ1 of the comparator CPA1 has a low level. The output signal IVQ1 of the logic inverting circuit IVA1 has a high level.

In addition, the output signal QA2 has a low level, and thus the switch element SWA2 is turned off. Since the switch element SWA2 is turned off, a current (electric charge) from the current source IGA2 is accumulated in the capacitor CA2, and the voltage VA2 of the node NA2 increases. When the voltage VA2 becomes larger than the reference voltage VRA, the comparator CPA2 changes the output signal CQ2 from a low level to a high level. Then, the output signal IVQ2 of the logic inverting circuit IVA2 changes from a high level to a low level, and the output signal QA2 of the NAND circuit NAA2 changes from a low level to a high level, thereby allowing the state to proceed to the first state.

4. Interface Circuit

Figure 11:
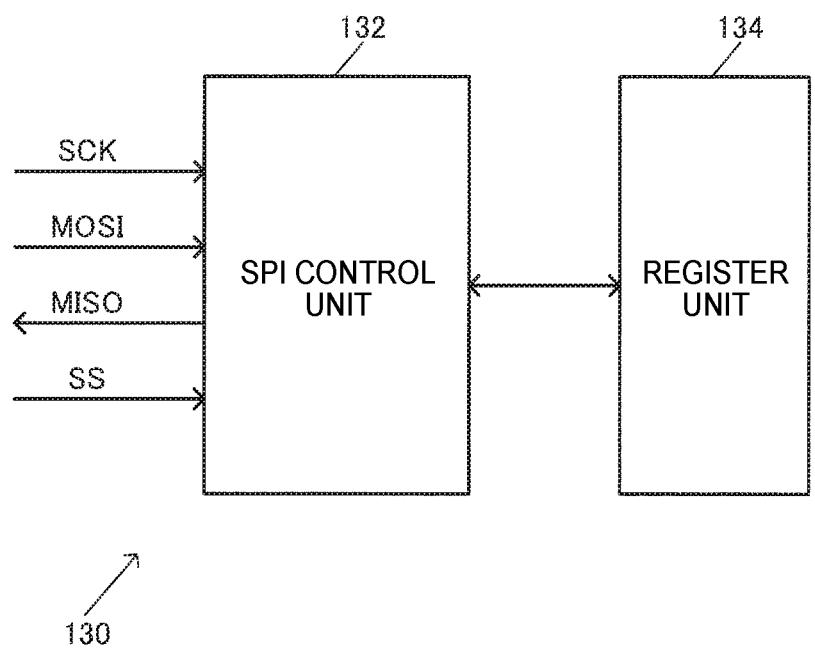
FIG. 11 illustrates an example of a detailed configuration of the interface circuit.

FIG. 11 illustrates an example of a detailed configuration of the interface circuit 130. Meanwhile, hereinafter, a description will be given of an example of a case where communication of an SPI system of four lines is performed, but communication performed by the interface circuit 130 is not limited to an SPI system of four lines. That is, a system may be used in which a clock signal is input from the outside of the circuit device 20, and serial data communication is performed on the basis of the clock signal.

The interface circuit 130 of FIG. 11 includes an SPI control unit 132 (SPI control circuit) and a register unit 134.

The serial clock signal SCK is input to the SPI control unit 132 through a serial clock line from the external device 200, the reception serial data MOSI is input thereto through a first serial data line, and a slave selected signal SS is input thereto through a slave select line. In addition, the SPI control unit 132 outputs the transmission serial data MISO to the external device 200 through a second serial data line. Specifically, the SPI control unit 132 includes a physical layer circuit and a communication processing circuit. For example, the physical layer circuit is an I/O buffer circuit that transmits and receives the serial clock signal SCK, the reception serial data MOSI, the transmission serial data MISO, and the slave selected signal SS. The communication processing circuit is a logic circuit that performs communication processing of SPI communication. For example, the communication processing circuit performs serial-parallel conversion of the reception serial data MOSI, a process of interpreting a command, a process of generating the transmission serial data MISO, parallel-serial conversion of the transmission serial data MISO, read-write control of the register unit 134, and the like.

Figure 12:
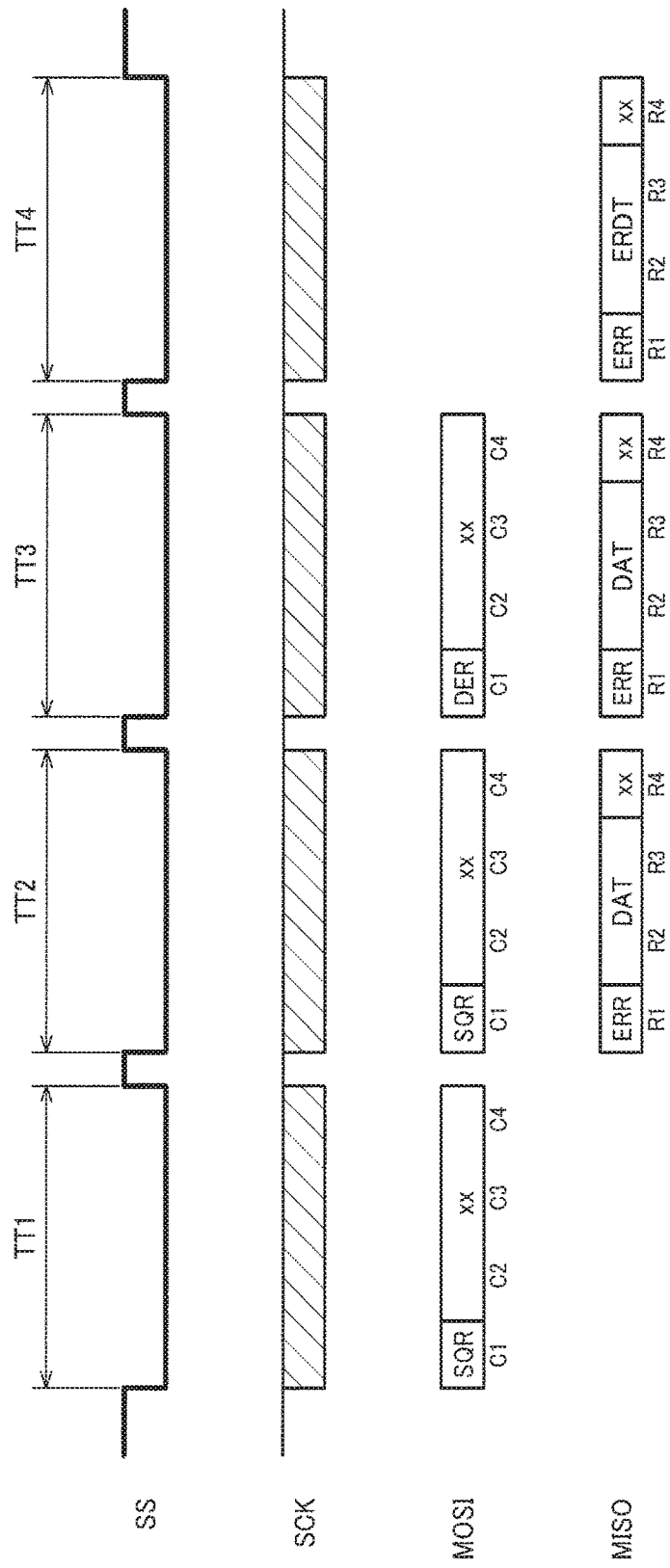
FIG. 12 is a timing chart illustrating operations of the interface circuit.

FIG. 12 is a timing chart illustrating operations of the interface circuit 130. Hereinafter, a period of time for which the slave selected signal SS is set to be in an active (low level) state is called a communication period.

The SPI control unit 132 receives pieces of command data C1 to C4 as the reception serial data MOSI in one communication period, and transmits pieces of response data R1 to R4 corresponding to the pieces of command data C1 to C4 as the transmission serial data MISO in the next one communication period. Meanwhile, "xx" of MOSI and MISO of FIG. 12 indicates "don't care". As indicated by a hatched portion of FIG. 12, the serial clock signal SCK is set to be in an active state in the communication period, and thus SPI control unit 132 performs communication processing in the communication period on the basis of the serial clock signal SCK.

In a first communication period TT1, the external device 200 outputs a data request command SQR as the command data C1. In the next second communication period TT2, the SPI control unit 132 outputs error data ERR as the response data R1, and outputs output data DAT as the pieces of response data R2 and R3. The error data ERR is error information indicating whether or not any error occurs in the circuit device 20. The output data DAT is, for example, physical quantity data (angular velocity data, acceleration data, or the like) which is detected in the physical quantity detection device 300 to be described later in FIG. 13. That is, the error data ERR is output as a portion of a response to a request for reading out the physical quantity data.

In a case where the error data ERR indicates the occurrence of an error, the external device 200 outputs an error detailed request command DER as the command data C1 in the next third communication period TT3. In the next fourth communication period TT4, the SPI control unit 132 outputs error data ERR as the response data R1, and outputs error detailed data ERDT as the pieces of response data R2 and R3. The error detailed data ERDT is data indicating detailed contents of an error, and includes error information EMK of the above-described master clock signal MCK and error information EF of each unit of the circuit device 20. The external device 200 can know what type of error has occurred in the circuit device 20, from the error detailed data ERDT.

5. Physical Quantity Detection Device

FIG. 13 illustrates an example of detailed configurations of the physical quantity detection device 300 and a circuit device 20a which is applied to the physical quantity detection device 300. Meanwhile, hereinafter, a description will be given of an example of a case where the physical quantity detection device 300 is a composite sensor that detects an angular velocity and an acceleration. However, the invention is not limited thereto, and a sensor detecting various physical quantities can be implemented as the physical quantity detection device 300.

The physical quantity detection device 300 includes the angular velocity detection element 13, the acceleration detection element 16, and the circuit device 20a. The circuit device 20a includes a master clock signal failure detection circuit 150a, a master clock signal generation circuit 120a, an interface circuit 130a, a defect diagnosis circuit 160a, a driving circuit 30, and a detection circuit 60. Meanwhile, the same components as the components previously described will be denoted by the same reference numerals and signs (or reference numerals obtained by attaching "a" to the same reference numerals), and a description thereof will not be repeated.

The angular velocity detection element 13 is an element (transducer) that converts an angular velocity of rotation centering on a predetermined axis into an electric signal. Examples of the angular velocity detection element 13 to be adopted may include a vibration gyro element of a type that generates detection vibration when a Coriolis force is applied thereto in a driving vibration state and detects an electrical field generated in a piezoelectric body by the detection vibration, a capacitance type vibration gyro sensor element that detects the detection vibration as a change in capacitance, and the like.

The acceleration detection element 16 is an element (transducer) that converts an acceleration in a direction of a predetermined axis into an electric signal. Examples of the acceleration detection element 16 to be adopted may include a capacitance type silicon MEMS acceleration detection element, a piezoelectric type or thermal sensing type acceleration detection element, and the like.

The driving circuit 30 outputs a driving signal DGA to drive the angular velocity detection element 13. For example, the driving circuit 30 receives a feedback signal DSA from the angular velocity detection element 13 and outputs the driving signal DGA corresponding to the feedback signal to thereby excite the angular velocity detection element 13.

The detection circuit 60 detects (extracts) an angular velocity on the basis of a detection signal SA from the angular velocity detection element 13. In addition, the detection circuit 60 detects (extracts) an acceleration on the basis of a detection signal SB from the acceleration detection element 16. Specifically, the detection circuit 60 includes a first AFE (Analog Front-End) circuit 61, a second AFE circuit 62, a first low-pass filter 87, a second low-pass filter 88, a multiplexer 90, an A/D conversion circuit 100, and a control circuit 110a.

The first AFE circuit 61 is a circuit that performs analog signal processing of the detection signal SA from the angular velocity detection element 13. The first AFE circuit 61 amplifies the detection signal SA, performs detection for extracting a signal corresponding to an angular velocity from the detection signal SA, and the like.

The first low-pass filter 87 is, for example, a passive filter (a resistor, a filter constituted by a capacitor), and performs low-pass filtering of an output signal AVA of the first AFE circuit 61. The first low-pass filter 87 functions as a filter that attenuates an unnecessary signal (for example, a signal of a detuning frequency which is a difference between a resonance frequency and a driving frequency of the angular velocity detection element 13) which cannot be removed by synchronous detection or an anti-aliasing filter of the A/D conversion circuit 100.

The second AFE circuit 62 is a circuit that performs analog signal processing of the detection signal SB from the acceleration detection element 16. The second AFE circuit 62 performs the amplification of the detection signal SB, and the like.

The second low-pass filter 88 is, for example, a passive filter (a resistor, a filter constituted by a capacitor), and performs low-pass filtering of an output signal AVB of the second AFE circuit 62. The second low-pass filter 88 functions as, for example, an anti-aliasing filter of the A/D conversion circuit 100.

The multiplexer 90 selects an output signal AVA' of the first low-pass filter 87 and an output signal AVB' of the second low-pass filter 88 in time division, and outputs the selected signal MQ.

The A/D conversion circuit 100 performs A/D conversion of the output signal MQ of the multiplexer 90 in time division. That is, A/D conversion of the output signal AVA' of the first low-pass filter 87 is performed to thereby output data DT corresponding to an angular velocity, and subsequently, A/D conversion of the output signal AVB' of the second low-pass filter 88 is performed to thereby output data DT corresponding to an acceleration. Examples of an A/D conversion type to be implemented may include a successive comparison type, a double integral type, a flash type, a pipeline type, and the like. The control circuit 110a performs frequency division of the master clock signal MCK and supplies the frequency-divided master clock signal to the A/D conversion circuit 100, and the A/D conversion circuit 100 performs an A/D conversion operation by the frequency-divided master clock signal MCK.

The control circuit 110a performs digital signal processing (a digital filtering process, a correction process, and the like) on the data DT (digital signal) from the A/D conversion circuit 100, and outputs angular velocity data (angular velocity information) corresponding to an angular velocity detected and acceleration data (acceleration data) corresponding to an acceleration detected. The angular velocity data and the acceleration data are transmitted to the external device 200 through the interface circuit 130a. In addition, the control circuit 110a performs a process of controlling the circuit device 20a. For example, a variety of switch control, mode setting, and the like using the circuit device 20a are performed by the control circuit 110a.

A failure detection signal is input to the defect diagnosis circuit 160*a* from each unit of the circuit device 20*a*. For example, the control circuit 110*a* includes a monitoring circuit that monitors a register value of a register, such as a coefficient register of a digital filter, which stores a predetermined value. In addition, the driving circuit 30 and the detection circuit 60 include a monitoring circuit that monitors the internal signal thereof. The defect diagnosis circuit 160*a* outputs error information based on a failure detection signal from the monitoring circuits, to the control circuit 110*a*.

The master clock signal failure detection circuit 150*a* detects a failure of the master clock signal MCK on the basis of the synchronization signal SYCA for the first AFE circuit 61 to perform synchronous detection. The synchronization signal SYCA corresponds to the error detection clock signal CKI of FIG. 1.

Meanwhile, a description has been given of an example of a case where the physical quantity detection device 300 detects an angular velocity and an acceleration of one axis, but the physical quantity detection device 300 may detect one of an angular velocity and an acceleration, may detect angular velocities of multi-axes, or may detect accelerations of multi-axes. For example, in a case where an angular velocity of only one axis is detected, the acceleration detection element 16, the second AFE circuit 62, the second low-pass filter 88, and the multiplexer 90 may be omitted. Alternatively, in a case where angular velocities of multi-axes are detected, a plurality of angular velocity detection elements 13 are provided, a plurality of first AFE circuits 61 and a plurality of first low-pass filters 87 which correspond to the angular velocity detection elements may be provided, and the multiplexer 90 may select output signals of the plurality of first low-pass filters 87 in time division.

6. Driving Circuit, Detection Circuit

Figure 14:
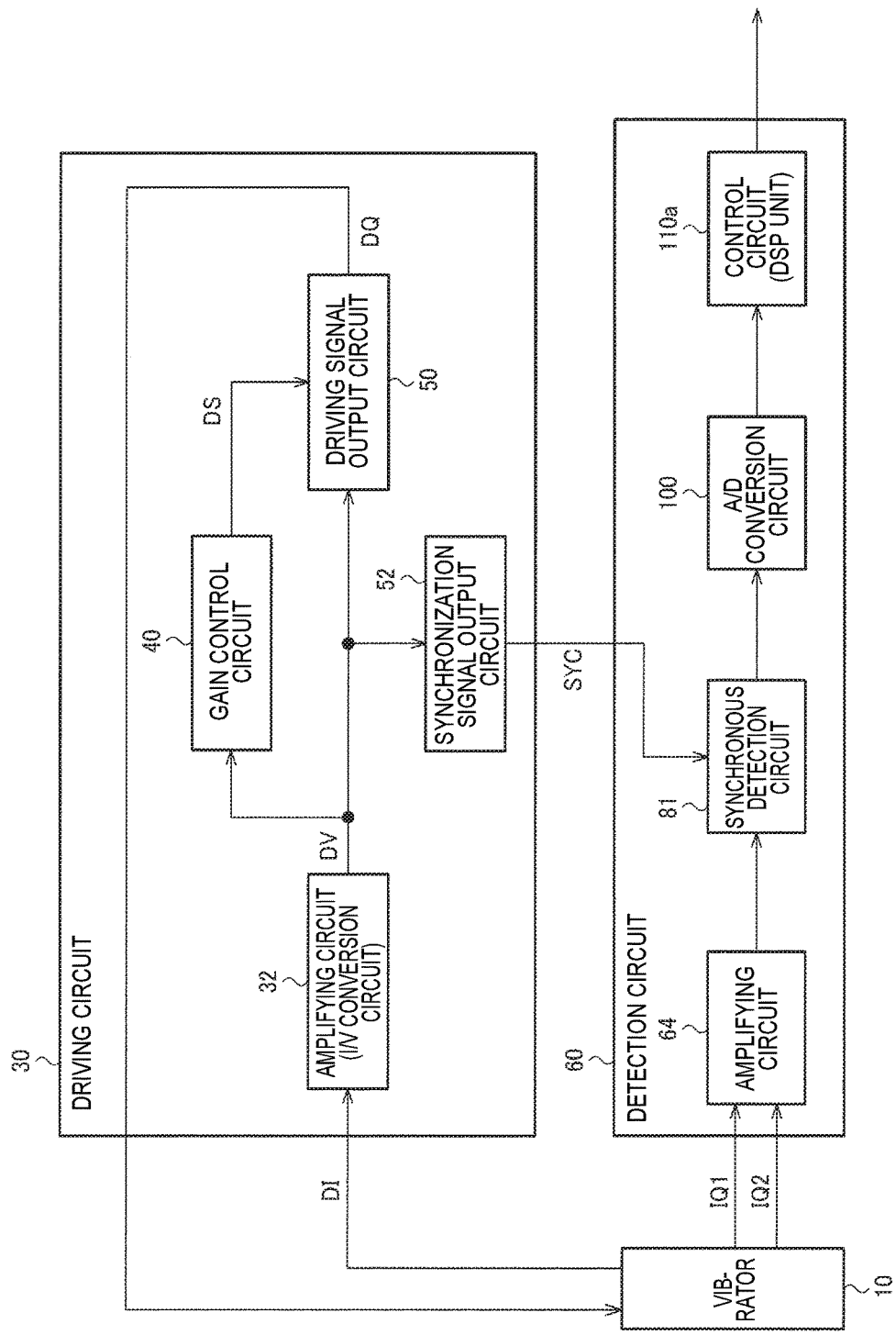
FIG. 14 illustrates an example of detailed configurations of a driving circuit that drives an angular velocity detection element, and a detection circuit that detects a detection signal from the angular velocity detection element.

FIG. 14 illustrates an example of detailed configurations of the driving circuit 30 that drives the angular velocity detection element 13, and the detection circuit 60 that detects a detection signal from the angular velocity detection element 13. Meanwhile, hereinafter, a description will be given of an example of a case where the angular velocity detection element 13 is the vibrator 10.

The driving circuit 30 includes an amplifying circuit 32 to which a feedback signal DI from the vibrator 10 is input, a gain control circuit 40 that performs automatic gain control, and a driving signal output circuit 50 that outputs a driving signal DQ to the vibrator 10. In addition, the driving circuit includes a synchronization signal output circuit 52 that outputs a synchronization signal SYC to the detection circuit 60.

The amplifying circuit 32 (I/V conversion circuit) amplifies the feedback signal DI from the vibrator 10. For example, a signal DI of a current from the vibrator 10 is converted into a signal DV of a voltage and is output. The amplifying circuit 32 can be realized by an operational amplifier, a feedback resistive element, a feedback capacitor, and the like.

The driving signal output circuit 50 outputs a driving signal DQ on the basis of the signal DV amplified by the amplifying circuit 32. For example, in a case where the driving signal output circuit 50 outputs a driving signal of a rectangular wave (or sine wave), the driving signal output circuit 50 can be realized by a comparator and the like.

The gain control circuit 40 (AGC) outputs a control voltage DS to the driving signal output circuit 50 to thereby control an amplitude of the driving signal DQ. Specifically, the gain control circuit 40 monitors the signal DV to thereby control a gain of an oscillation loop. For example, in the driving circuit 30, it is necessary to keep an amplitude of a driving voltage, which is supplied to a driving vibration unit of the vibrator 10, constant in order to keep the sensitivity of a gyro sensor constant. For this reason, the gain control circuit 40 for automatically adjusting a gain is provided within an oscillation loop of a driving vibration system. The gain control circuit 40 variably performs the automatic adjustment of a gain so that an amplitude (vibration speed of the drive vibration unit of the vibrator 10) of the feedback signal DI from the vibrator 10 is constant. The gain control circuit 40 can be realized by a full-wave rectifier that performs full-wave rectification of an output signal DV of the amplifying circuit 32, an integrator that performs integration processing of an output signal of the full-wave rectifier, or the like.

The synchronization signal output circuit 52 receives the signal DV amplified by the amplifying circuit 32, and outputs a synchronization signal SYC (reference signal) to the detection circuit 60. The synchronization signal output circuit 52 can be realized by a comparator that performs binarization of a signal DV of a sine wave (alternating current) to thereby generate a synchronization signal SYC of a rectangular wave, a phase adjustment circuit (phase shifter) that performs phase adjustment of the synchronization signal SYC, or the like.

The detection circuit 60 includes an amplifying circuit 64, a synchronous detection circuit 81, an A/D conversion circuit 100, and a control circuit 110*a* (DSP unit). The amplifying circuit 64 receives first and second detection signals IQ1 and IQ2 from the vibrator 10 to thereby perform charge-voltage conversion, differential signal amplification, gain adjustment, and the like. The synchronous detection circuit 81 performs synchronous detection on the basis of the synchronization signal SYC from the driving circuit 30. The A/D conversion circuit 100 performs A/D conversion of a signal after synchronous detection. The control circuit 110*a* performs a digital filtering process or a digital correction process (for example, a zero point correction process, a sensitivity correction process, or the like) on a digital signal from the A/D conversion circuit 100.

Meanwhile, in a case where the configuration of FIG. 14 is applied to FIG. 13, the amplifying circuit 64 and the synchronous detection circuit 81 correspond to the first AFE circuit 61 of FIG. 13, and the first low-pass filter 87 and the multiplexer 90 are provided between the synchronous detection circuit 81 and the A/D conversion circuit 100. In addition, the feedback signal DI, the driving signal DQ, and the synchronization signal SYC correspond to the feedback signal DSA, the driving signal DGA, and the synchronization signal SYCA of FIG. 13, respectively. In addition, the first and second detection signals IQ1 and IQ2 correspond to the detection signal SA of FIG. 13.

Figure 15:
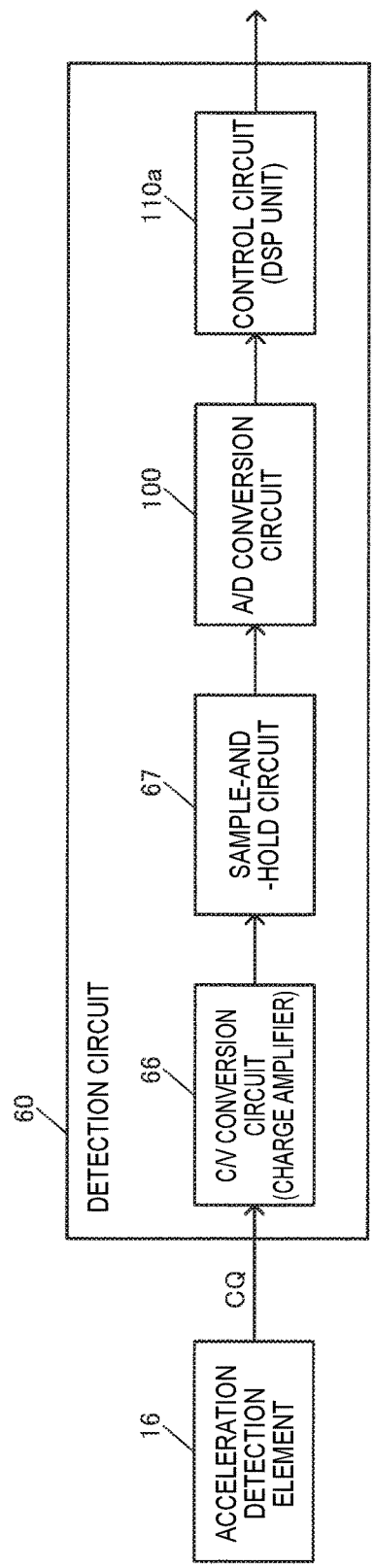
FIG. 15 illustrates an example of detailed configurations of the detection circuit that detects a detection signal from an acceleration detection element.

FIG. 15 illustrates an example of detailed configurations of the detection circuit 60 that detects a detection signal from the acceleration detection element 16. Meanwhile, hereinafter, a description will be given of an example of a case where the acceleration detection element 16 is a capacitance type acceleration detection element.

The acceleration detection element 16 includes a movable portion that moves by an acceleration, and a fixed electrode. The movable portion is provided with an electrode that faces the fixed electrode, and a distance between the fixed electrode and the electrode of the movable portion varies by the movable portion moving by an acceleration, thereby changing capacitance between the electrodes. The acceleration detection element 16 outputs a change in charge (change accumulated in the electrode) which is generated due to the change in capacitance between the electrodes, as a detection signal CQ.

The detection circuit 60 detects an acceleration on the basis of the detection signal CQ which is output from the acceleration detection element 16. The detection circuit 60 includes a C/V conversion circuit 66 (charge amplifier), a sample-and-hold circuit 67, the A/D conversion circuit 100, and the control circuit 110a (DSP unit).

The C/V conversion circuit 66 converts the detection signal CQ (charge) from the acceleration detection element 16 into a voltage. The sample-and-hold circuit 67 samples and holds an output signal of the C/V conversion circuit 66. Specifically, the movable portion of the acceleration detection element 16 vibrates by the application of a driving signal with a frequency of a carrier wave signal. The detection signal from the acceleration detection element 16 includes a carrier wave signal generated by the vibration of the movable portion, and a signal corresponding to an acceleration which is transported by the carrier wave signal. The sample-and-hold circuit 67 performs synchronous detection of the output signal of the C/V conversion circuit 66 by sampling and holding, and extracts a signal corresponding to an acceleration. The A/D conversion circuit 100 performs A/D conversion of an output signal of the sample-and-hold circuit 67. The control circuit 110a performs a digital filtering process or a digital correction process on a digital signal from the A/D conversion circuit 100.

Meanwhile, in a case where the configuration of FIG. 15 is applied to FIG. 13, the C/V conversion circuit 66 and the sample-and-hold circuit 67 correspond to the second AFE circuit 62 of FIG. 13, and the second low-pass filter 88 and the multiplexer 90 are provided between the sample-and-hold circuit 67 and the A/D conversion circuit 100. In addition, the detection signal CQ corresponds to the detection signal SB of FIG. 13.

7. Oscillator

Figure 16:
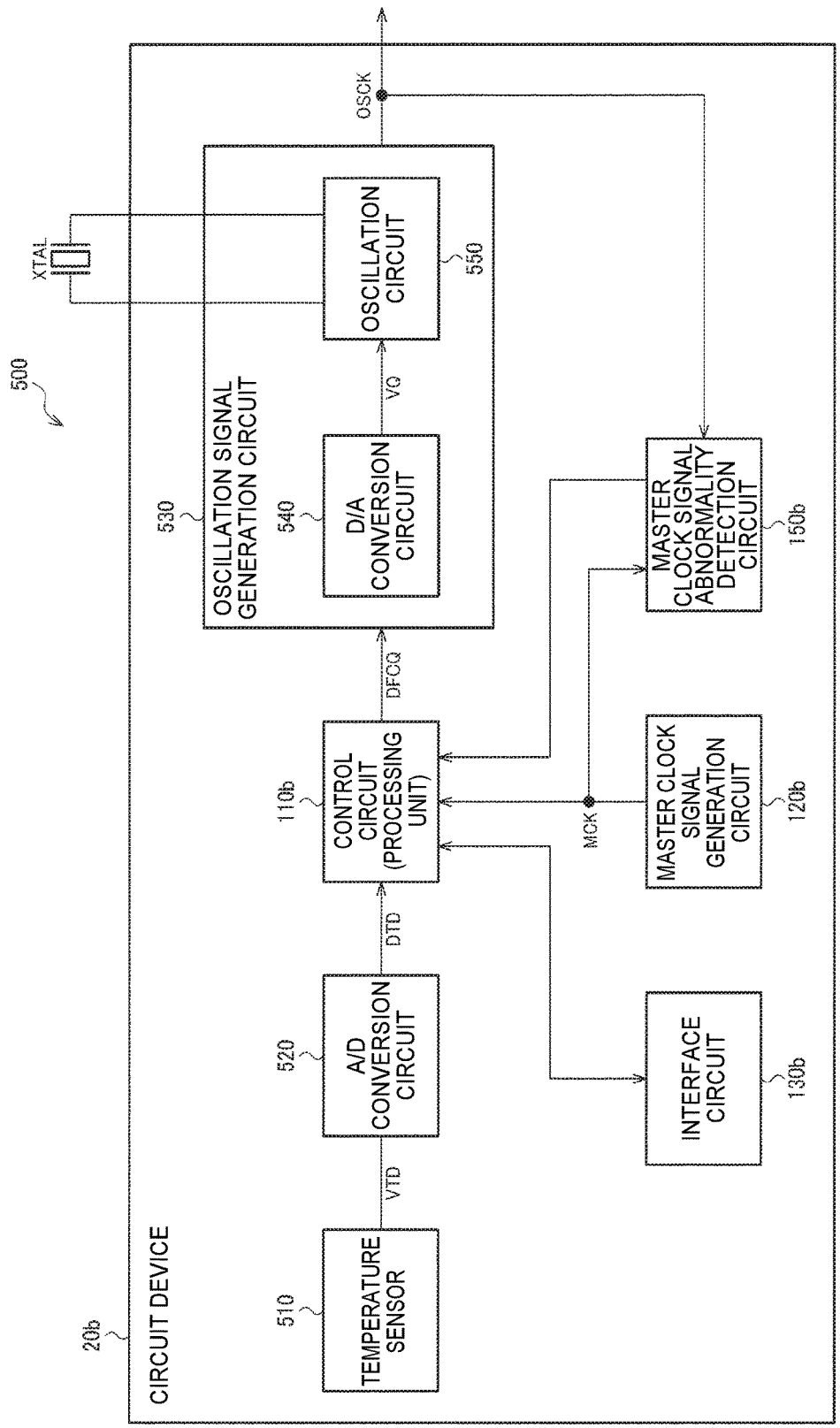
FIG. 16 illustrates an example of detailed configurations of an oscillator and a circuit device which is applied to the oscillator.

FIG. 16 illustrates an example of detailed configurations of the oscillator 500 and a circuit device 20b which is applied to the oscillator 500. Examples of the oscillator 500 to be implemented may include a temperature compensated crystal oscillator (TCXO) that compensates for temperature dependency of an oscillation frequency of a vibrator to thereby generate an oscillation signal with a constant frequency, an oven controlled crystal oscillator (OCXO) that keeps a vibrator at a constant temperature by a thermostatic chamber to thereby generate an oscillation signal with a constant frequency, and the like.

The oscillator 500 includes a vibrator XTAL and the circuit device 20b. The circuit device 20b includes a temperature sensor 510, an A/D conversion circuit 520, a control circuit 110b (processing unit), an oscillation signal generation circuit 530, an interface circuit 130b, a master clock signal generation circuit 120b, and a master clock signal failure detection circuit 150b. Meanwhile, the same components as the components previously described will be denoted by the same reference numerals and signs (or reference numerals obtained by attaching "b" to the same reference numerals), and a description thereof will not be repeated.

The temperature sensor 510 outputs a temperature detection voltage VTD. Specifically, a temperature dependent voltage varying depending on the temperature of environment (circuit device 20b) is output as a temperature detection voltage VTD. The temperature sensor 510 is, for example, a circuit that outputs a forward voltage of PN junction (diode) as a temperature dependent voltage.

The A/D conversion circuit 520 performs A/D conversion of the temperature detection voltage VTD and outputs temperature detection data DTD. For example, digital temperature detection data DTD (A/D result data) corresponding to a result of the A/D conversion of the temperature detection voltage VTD is output. As an A/D conversion type of the A/D conversion circuit 520, for example, a successive comparison type, a method similar to the successive comparison type, or the like can be adopted. Meanwhile, the A/D conversion type is not limited to such a type, and various types (a counting type, a parallel comparison type, a series parallel type, or the like) can be adopted.

The control circuit 110b performs various signal processing (digital signal processing). For example, the control circuit 110b performs temperature compensation processing of an oscillation frequency (frequency of an oscillation signal) on the basis of the temperature detection data DTD. Specifically, the control circuit 110b performs temperature compensation processing for reducing a fluctuation in an oscillation frequency in a case where there is a change in temperature, on the basis of the temperature detection data DTD varying depending on temperature, coefficient data for temperature compensation processing (data of a coefficient of an approximation function), and the like. The control circuit 110b outputs frequency control data DFCQ (frequency control code) after signal processing.

The vibrator XTAL is, for example, a quartz crystal vibrator of a thickness-shear vibration type such as an AT-cut type or an SC-cut type, and a piezoelectric vibrator of a flexural vibration type. Meanwhile, as the vibrator XTAL, a surface acoustic wave (SAW) resonator as a piezoelectric vibrator, a micro electro mechanical systems (MEMS) as a silicon vibrator, or the like can be adopted. As a substrate material of the vibrator XTAL, piezoelectric single crystal such as quartz crystal, lithium tantalate, or lithium niobate, a piezoelectric material such as piezoelectric ceramic, for example, lead zirconate titanate, a silicon semiconductor material, or the like can be used. As an excitation unit for the vibrator XTAL, an excitation unit based on a piezoelectric effect may be used, or electrostatic driving based on a Coulomb force may be used.

The oscillation signal generation circuit 530 generates an oscillation signal OSCK. For example, the oscillation signal generation circuit 530 generates the oscillation signal OSCK of an oscillation frequency which is set by the frequency control data DFCQ from the control circuit 110b, by using the frequency control data DFCQ and the vibrator XTAL. As an example, the oscillation signal generation circuit 530 oscillates the vibrator XTAL at an oscillation frequency which is set by the frequency control data DFCQ to thereby generate the oscillation signal OSCK.

The oscillation signal generation circuit 530 includes a D/A conversion circuit 540 (D/A conversion unit) and an oscillation circuit 550.

The D/A conversion circuit 540 performs D/A conversion of the frequency control data DFCQ from the control circuit 110b. As a D/A conversion type of the D/A conversion circuit 540, for example, a resistance string type (resistance division type) can be adopted. However, the D/A conversion type is not limited thereto, and various types such as a resistance ladder type (R-2 R ladder type or the like), a capacity array type, and a pulse width modulation type can be adopted. In addition, the D/A conversion circuit 540 may include the control circuit thereof, a modulation circuit (dither modulation, PWM modulation, or the like), a filter circuit, or the like, other than a D/A converter.

The oscillation circuit 550 generates an oscillation signal OSCK by using an output voltage VQ of the D/A conversion circuit 540 and the vibrator XTAL. The oscillation circuit 550 is connected to the vibrator XTAL through first and second terminals for a vibrator (pads for a vibrator). For example, the oscillation circuit 550 oscillates the vibrator XTAL (a piezoelectric vibrator, a resonator, or the like) to thereby generate the oscillation signal OSCK. Specifically, the oscillation circuit 550 oscillates the vibrator XTAL at an oscillation frequency for setting the output voltage VQ of the D/A conversion circuit 540 to be a frequency control voltage (oscillation control voltage). For example, in a case where the oscillation circuit 550 is a circuit (VCO) that controls the oscillation of the vibrator XTAL by the control of a voltage, the oscillation circuit 550 may include a variable capacitor (a varicap or the like) of which the capacitance value varies depending on a frequency control voltage.

The master clock signal failure detection circuit 150*b* detects a failure of the master clock signal MCK on the basis of the oscillation signal OSCK. The oscillation signal OSCK corresponds to the error detection clock signal CKI of FIG. 1.

Meanwhile, the oscillation signal generation circuit 530 is not limited to the above-described configuration. For example, the variable capacitor of the oscillation circuit 550 may include a capacitor array and a switch circuit, and the switch circuit may be controlled on the basis of the frequency control data DFCQ, thereby variably controlling the capacity of the capacitor array and controlling an oscillation frequency of the oscillation circuit 550 on the basis of the capacity of the variable capacitor. Alternatively, the oscillation signal generation circuit 530 may be a circuit that generates the oscillation signal OSCK according to a direct digital synthesizer system. For example, the oscillation signal OSCK of an oscillation frequency which is set on the basis of the frequency control data DFCQ may be digitally generated using an oscillation signal of the vibrator XTAL (oscillation source of a fixed oscillation frequency) as a reference signal.

8. Vehicle, Electronic Apparatus

FIGS. 17 to 20 illustrate an example of an electronic apparatus and a vehicle including the circuit device 20 of this embodiment. The circuit device 20 of this embodiment can be incorporated into various vehicles such as a car, an aircraft, a motorbike, a bicycle, and a ship. The vehicles are devices or apparatuses which are provided with driving mechanisms such as engines or motors, steering mechanisms such as handles or rudders, and various electronic apparatuses, and move on the ground, in the air, and in the sea.

Figure 17:
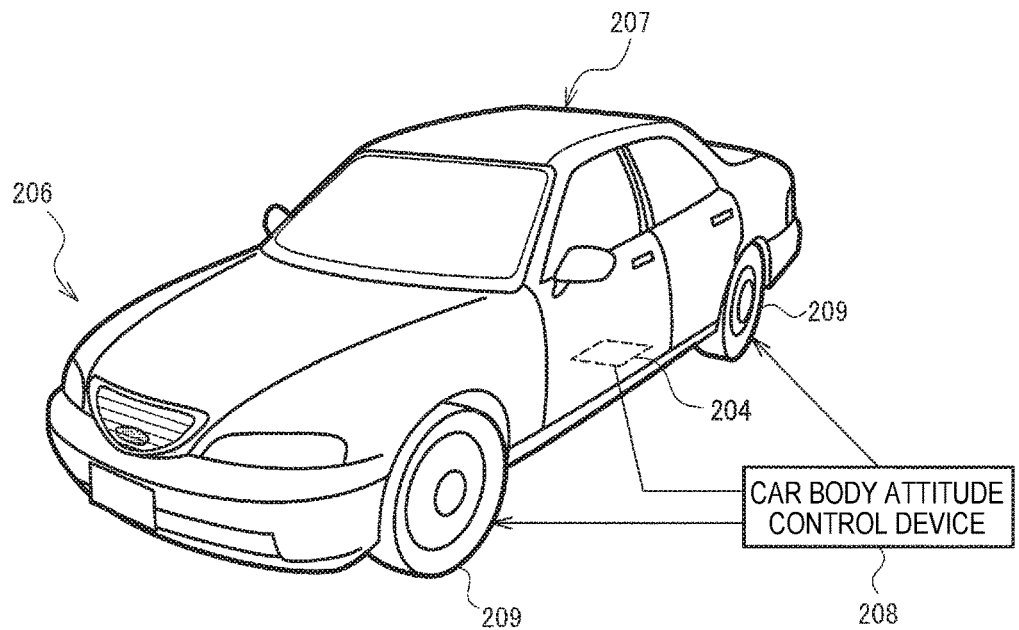
FIG. 17 illustrates an example of an electronic apparatus or a vehicle including the circuit device of this embodiment.

FIG. 17 schematically illustrates an automobile 206 as a specific example of the vehicle. A gyro sensor 204 including the vibrator 10 and the circuit device 20 is incorporated into the automobile 206. The gyro sensor 204 can detect the attitude of a car body 207. A detection signal of the gyro sensor 204 is supplied to a car body attitude control device 208. The car body attitude control device 208 may control the stiffness and softness of a suspension or a brake of each car wheel 209, for example, in accordance with the attitude of the car body 207. In addition, such attitude control may be used in various vehicles such as a bipedal walking robot, an airplane, and a helicopter. The gyro sensor 204 may be incorporated thereinto in realizing attitude control.

Figure 18:
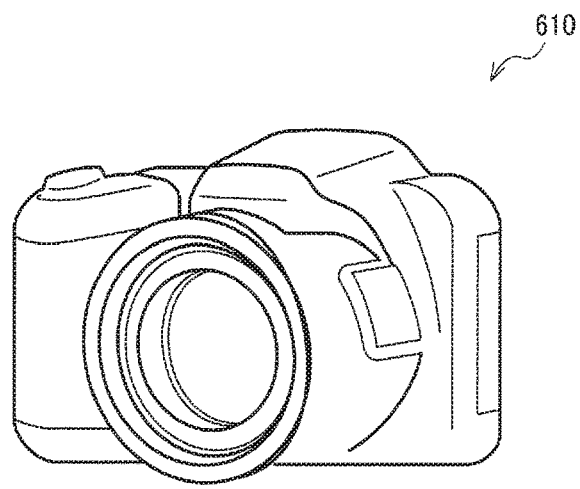
FIG. 18 illustrates an example of an electronic apparatus or a vehicle including the circuit device of this embodiment.
Figure 19:
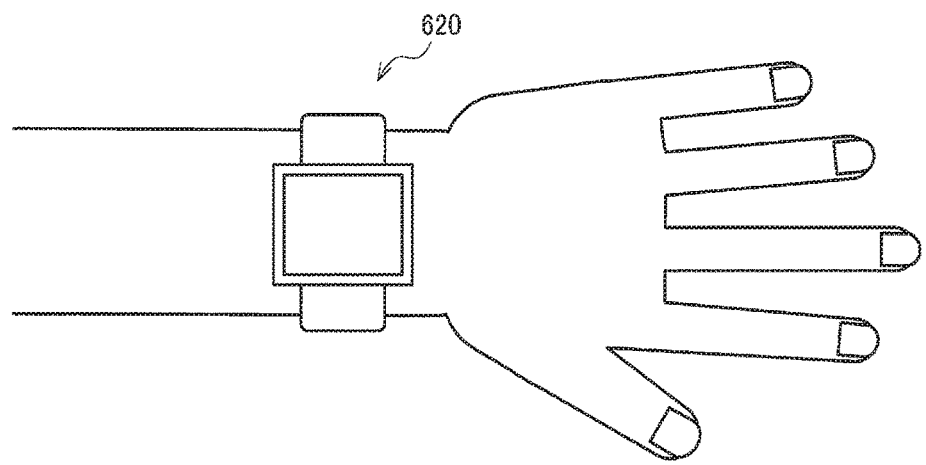
FIG. 19 illustrates an example of an electronic apparatus or a vehicle including the circuit device of this embodiment.

FIGS. 18 and 19 schematically illustrate a digital still camera 610 and a biological information detecting apparatus 620 as specific examples of electronic apparatuses. In this manner, the circuit device 20 of this embodiment can be applied to various electronic apparatuses such as the digital still camera 610 and the biological information detecting apparatus 620 (wearable health apparatuses, for example, a pulse meter, a pedometer, an activity meter, and the like). For example, it is possible to perform shake correction or the like using a gyro sensor or an acceleration sensor in the digital still camera 610. In addition, it is possible to detect body movement or a movement state of a user by using a gyro sensor or an acceleration sensor in the biological information detecting apparatus 620.

Figure 20:
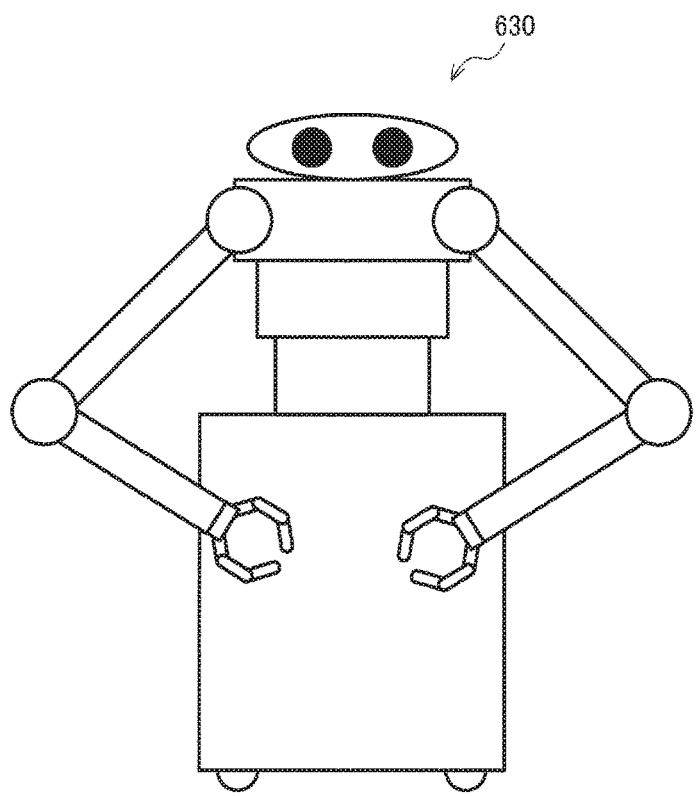
FIG. 20 illustrates an example of an electronic apparatus or a vehicle including the circuit device of this embodiment.

FIG. 20 schematically illustrates a robot 630 as a specific example of a vehicle or an electronic apparatus. In this manner, the circuit device 20 of this embodiment can also be applied to a movable portion (arm and joints) and a main body of the robot 630. The robot 630 can be implemented in any one of the vehicle (running and walking robot) and the electronic apparatus (non-running and non-walking robot). In a case of the running and walking robot, for example, the circuit device 20 of the embodiment can be applied to autonomous running.

Meanwhile, as described above, this embodiment has been described in detail. However, those skilled in the art can easily understand that various modifications can be made without substantially departing from the new matters and the effects of the invention. Accordingly, all of the modifications are deemed to be included within the scope of the invention. For example, terms described at least once together with broader or different synonymous terms in the specification or drawings can be replaced by the different terms even in any region of the specification or drawings. In addition, all of the combinations of this embodiment and modification examples are included in the scope of the invention. In addition, the configurations, operations, and the like of the circuit device, the external device, the physical quantity detection device, the oscillator, the electronic apparatus, and the vehicle are not also limited to those described in this embodiment, and various modifications can be made.

The entire disclosure of Japanese Patent Application Nos. 2016-062571, filed Mar. 25, 2016 and 2016-185093, filed Sep. 23, 2016 are expressly incorporated by reference herein.

What is claimed is:

1. A circuit device comprising:
   a control circuit that operates on the basis of a master clock signal;
   and an interface circuit that includes a register unit and transmits data on the basis of an external clock signal which is input from an external device,
   wherein the register unit takes up error information of the master clock signal on the basis of the external clock signal and stores the taken-up error information, and
   wherein the interface circuit transmits the data, including the error information stored in the register unit.

2. The circuit device according to claim 1, further comprising:
   a master clock signal failure detection circuit that detects a failure of the master clock signal and outputs the error information,
   indicating that the master clock signal is set to be in a failure state, to the register unit in a case where the failure is detected.

3. The circuit device according to claim 2,
   wherein the register unit takes up the error information from the master clock signal failure detection circuit on the basis of the external clock signal.

4. The circuit device according to claim 2,
wherein the master clock signal failure detection circuit detects a failure of the master clock signal on the basis of an error detection clock signal which is a clock signal different from the master clock signal, and outputs the error information to the register unit.

5. The circuit device according to claim 4, further comprising:
a driving circuit that oscillates a vibrator,
wherein the error detection clock signal is a clock signal which is generated by oscillating the vibrator.

6. The circuit device according to claim 2,
wherein the master clock signal failure detection circuit includes a first flip flop circuit that latches an input clock signal based on the master clock signal,
on the basis of an error detection clock signal which is a clock signal different from the master clock signal,
a second flip flop circuit that latches a first output signal from the first flip flop circuit on the basis of the error detection clock signal,
an exclusive OR circuit that obtains an exclusive OR of the first output signal and a second output signal from the second flip flop circuit,
and a counter that counts a period of time for which an output signal of the exclusive OR circuit is set to be a first logic level,
on the basis of the error detection clock signal,
and outputs the error information indicating that the master clock signal is set to be in a failure state,
in a case where a counted value is set to be a predetermined value.

7. The circuit device according to claim 1, further comprising:
a defect diagnosis circuit that operates by the master clock signal,
wherein the register unit includes a failure diagnosis resister that takes up error information from the defect diagnosis circuit.

8. The circuit device according to claim 1,
wherein the interface circuit is an interface circuit of a serial peripheral interface (SPI) system or an inter-integrated circuit (I2 C) system.

9. The circuit device according to claim 1,
further comprising:
a master clock signal generation circuit that generates the master clock signal.

10. A circuit device comprising:
a master clock signal failure detection circuit that detects a failure of a master clock signal;
and a register circuit that takes up error information of the master clock signal on the basis of an external clock signal which is input from an external device comprising a central processing unit (CPU).

11. The circuit device according to claim 10,
further comprising:
an interface circuit that transmits data including the error information stored in the register circuit on the basis of the external clock signal.

12. A circuit device comprising:
a failure detection circuit that detects a failure of a first clock signal on the basis of a second clock signal different from the first clock signal;
and a register circuit that takes up error information of the first clock signal on the basis of a third clock signal which is an external clock signal input from an external device comprising a central processing unit (CPU),
wherein each of the first clock signal, the second clock signal and third clock signal are different clock signals from each other.

13. A method of detecting a failure of a master clock signal,
the method comprising:
detecting a failure of the master clock signal by a clock signal other than the master clock signal;
taking up error information of the master clock signal in a register circuit on the basis of an external clock signal which is input from an external device comprising a central processing unit (CPU);
and transmitting data including the error information stored in the register circuit on the basis of the external clock signal,
wherein each of the clock signal, the external clock signal and the master clock signal are different clock signals from each other.

14. A physical quantity detection device comprising:
the circuit device according to claim 1;
and a physical quantity transducer.

15. The physical quantity detection device according to claim 14,
wherein the physical quantity transducer is at least one of an acceleration detection element and an angular velocity detection element.

16. An oscillator comprising: the circuit device according to claim 1; and a vibrator.

17. An electronic apparatus comprising the circuit device according to claim 1.

18. A vehicle comprising the circuit device according to claim 1.

* * * * *